US012804918B2

(12) United States Patent
Uzoh

(10) Patent No.: US 12,804,918 B2
(45) Date of Patent: Nov. 17, 2026

(54) REDUCED PARASITIC CAPACITANCE IN BONDED STRUCTURES

(71) Applicant: ADEIA SEMICONDUCTOR TECHNOLOGIES LLC, San Jose, CA (US)

(72) Inventor: Cyprian Emeka Uzoh, San Jose, CA (US)

(73) Assignee: ADEIA SEMICONDUCTOR TECHNOLOGIES LLC, San Jose, CA (US)

( * ) Notice: Subject to any disclaimer, the term of this patent is extended or adjusted under 35 U.S.C. 154(b) by 471 days.

(21) Appl. No.: 18/046,717

(22) Filed: Oct. 14, 2022

(65) Prior Publication Data

US 2023/0122531 A1 Apr. 20, 2023

Related U.S. Application Data

(60) Provisional application No. 63/257,035, filed on Oct. 18, 2021.

(51) Int. Cl.
*H01L 23/00* (2006.01)
*H01L 23/522* (2006.01)
(Continued)

(52) U.S. Cl.
CPC ............. *H10D 1/716* (2025.01); *H10D 1/042* (2025.01); *H10D 1/043* (2025.01);
(Continued)

(58) Field of Classification Search
CPC ......... H01L 24/08; H01L 24/05; H01L 24/80; H01L 25/0657; H01L 2224/08121;
(Continued)

(56) References Cited

U.S. PATENT DOCUMENTS 5,753,536 A 5/1998 Sugiyama et al.
5,771,555 A 6/1998 Eda et al.
(Continued)

FOREIGN PATENT DOCUMENTS

CN 110690202 A * 1/2020 ........... H01L 21/764
CN 111564424 A * 8/2020 ............. H01L 24/06
(Continued)

OTHER PUBLICATIONS

International Search Report and Written Opinion, International Application No. PCT/US2022/046748, mailed Feb. 13, 2023, 11 pages.

(Continued)

*Primary Examiner* — Mamadou L Diallo
(74) *Attorney, Agent, or Firm* — Knobbe, Martens, Olson & Bear LLP

(57) ABSTRACT

Bonded structures having conductive features and isolation features are disclosed. In one example, a bonded structure can include a first element including a first insulating layer and at least two first conductive features disposed in the first insulating layer. The bonded structure can also include a second element including a second insulating layer and at least two second conductive features disposed in the second insulating substrate. The first element can be directly bonded to the second element with the at least two first conductive features aligned with the at least two second conductive features. The bonded structure can also include an isolation feature in the second insulating layer and between the at least two second conductive features. The isolation feature can have a dielectric constant lower than a dielectric constant of the second insulating layer.

26 Claims, 22 Drawing Sheets

(51) Int. Cl.

| | |
|---|---|
| ***H01L 25/065*** | (2023.01) |
| ***H10D 1/00*** | (2025.01) |
| ***H10D 1/68*** | (2025.01) |
| ***H10W 20/40*** | (2026.01) |
| ***H10W 90/00*** | (2026.01) |
| *H10W 72/00* | (2026.01) |
| *H10W 72/90* | (2026.01) |
| *H10W 80/00* | (2026.01) |
| *H10W 90/20* | (2026.01) |
| *H10W 90/24* | (2026.01) |

(52) U.S. Cl.
CPC ....... *H10W 20/496* (2026.01); *H10W 72/981* (2026.01); *H10W 90/00* (2026.01); *H10W 72/01* (2026.01); *H10W 72/01908* (2026.01); *H10W 72/932* (2026.01); *H10W 72/953* (2026.01); *H10W 80/312* (2026.01); *H10W 80/327* (2026.01); *H10W 80/701* (2026.01); *H10W 80/721* (2026.01); *H10W 80/732* (2026.01); *H10W 90/20* (2026.01); *H10W 90/24* (2026.01); *H10W 90/792* (2026.01)

(58) Field of Classification Search
CPC . H01L 2224/08145; H01L 2224/80895; H01L 2224/80896; H01L 2224/80001; H01L 23/53295
See application file for complete search history.

(56) References Cited

U.S. PATENT DOCUMENTS

| | | | |
|---|---|---|---|
| 5,793,272 | A | 8/1998 | Burghartz et al. |
| 6,080,640 | A | 6/2000 | Gardner et al. |
| 6,114,937 | A | 9/2000 | Burghartz et al. |
| 6,423,640 | B1 | 7/2002 | Lee et al. |
| 6,465,892 | B1 | 10/2002 | Suga |
| 6,887,769 | B2 | 5/2005 | Kellar et al. |
| 6,908,027 | B2 | 6/2005 | Tolchinsky et al. |
| 7,045,453 | B2 | 5/2006 | Canaperi et al. |
| 7,105,980 | B2 | 9/2006 | Abbott et al. |
| 7,193,423 | B1 | 3/2007 | Dalton et al. |
| 7,750,488 | B2 | 7/2010 | Patti et al. |
| 7,803,693 | B2 | 9/2010 | Trezza |
| 8,183,127 | B2 | 5/2012 | Patti et al. |
| 8,349,635 | B1 | 1/2013 | Gan et al. |
| 8,377,798 | B2 | 2/2013 | Peng et al. |
| 8,441,131 | B2 | 5/2013 | Ryan |
| 8,476,165 | B2 | 7/2013 | Trickett et al. |
| 8,482,132 | B2 | 7/2013 | Yang et al. |
| 8,501,537 | B2 | 8/2013 | Sadaka et al. |
| 8,524,533 | B2 | 9/2013 | Tong et al. |
| 8,620,164 | B2 | 12/2013 | Heck et al. |
| 8,647,987 | B2 | 2/2014 | Yang et al. |
| 8,697,493 | B2 | 4/2014 | Sadaka |
| 8,716,105 | B2 | 5/2014 | Sadaka et al. |
| 8,802,538 | B1 | 8/2014 | Liu |
| 8,809,123 | B2 | 8/2014 | Liu et al. |
| 8,841,002 | B2 | 9/2014 | Tong |
| 9,093,350 | B2 | 7/2015 | Endo et al. |
| 9,142,517 | B2 | 9/2015 | Liu et al. |
| 9,171,756 | B2 | 10/2015 | Enquist et al. |
| 9,184,125 | B2 | 11/2015 | Enquist et al. |
| 9,224,704 | B2 | 12/2015 | Landru |
| 9,230,941 | B2 | 1/2016 | Chen et al. |
| 9,257,399 | B2 | 2/2016 | Kuang et al. |
| 9,299,736 | B2 | 3/2016 | Chen et al. |
| 9,312,229 | B2 | 4/2016 | Chen et al. |
| 9,331,149 | B2 | 5/2016 | Tong et al. |
| 9,337,235 | B2 | 5/2016 | Chen et al. |
| 9,385,024 | B2 | 7/2016 | Tong et al. |
| 9,394,161 | B2 | 7/2016 | Cheng et al. |
| 9,431,368 | B2 | 8/2016 | Enquist et al. |
| 9,437,572 | B2 | 9/2016 | Chen et al. |
| 9,443,796 | B2 | 9/2016 | Chou et al. |
| 9,461,007 | B2 | 10/2016 | Chun et al. |
| 9,496,239 | B1 | 11/2016 | Edelstein et al. |
| 9,536,848 | B2 | 1/2017 | England et al. |
| 9,559,081 | B1 | 1/2017 | Lai et al. |
| 9,620,481 | B2 | 4/2017 | Edelstein et al. |
| 9,656,852 | B2 | 5/2017 | Cheng et al. |
| 9,723,716 | B2 | 8/2017 | Meinhold |
| 9,728,521 | B2 | 8/2017 | Tsai et al. |
| 9,741,620 | B2 | 8/2017 | Uzoh et al. |
| 9,799,587 | B2 | 10/2017 | Fujii et al. |
| 9,852,988 | B2 | 12/2017 | Enquist et al. |
| 9,893,004 | B2 | 2/2018 | Yazdani |
| 9,899,442 | B2 | 2/2018 | Katkar |
| 9,929,050 | B2 | 3/2018 | Lin |
| 9,941,241 | B2 | 4/2018 | Edelstein et al. |
| 9,941,243 | B2 | 4/2018 | Kim et al. |
| 9,953,941 | B2 | 4/2018 | Enquist |
| 9,960,142 | B2 | 5/2018 | Chen et al. |
| 10,002,844 | B1 | 6/2018 | Wang et al. |
| 10,026,605 | B2 | 7/2018 | Doub et al. |
| 10,075,657 | B2 | 9/2018 | Fahim et al. |
| 10,177,111 | B2 | 1/2019 | Kamphuis et al. |
| 10,204,893 | B2 | 2/2019 | Uzoh et al. |
| 10,269,756 | B2 | 4/2019 | Uzoh |
| 10,276,619 | B2 | 4/2019 | Kao et al. |
| 10,276,909 | B2 | 4/2019 | Huang et al. |
| 10,418,277 | B2 | 9/2019 | Cheng et al. |
| 10,446,456 | B2 | 10/2019 | Shen et al. |
| 10,446,487 | B2 | 10/2019 | Huang et al. |
| 10,446,532 | B2 | 10/2019 | Uzoh et al. |
| 10,508,030 | B2 | 12/2019 | Katkar et al. |
| 10,522,499 | B2 | 12/2019 | Enquist et al. |
| 10,535,564 | B2 | 1/2020 | Uzoh et al. |
| 10,700,002 | B2 | 6/2020 | Uzoh et al. |
| 10,707,087 | B2 | 7/2020 | Uzoh et al. |
| 10,784,191 | B2 | 9/2020 | Huang et al. |
| 10,790,262 | B2 | 9/2020 | Uzoh et al. |
| 10,818,570 | B1 * | 10/2020 | England .............. H01L 25/0657 |
| 10,840,135 | B2 | 11/2020 | Uzoh |
| 10,840,205 | B2 | 11/2020 | Fountain, Jr. et al. |
| 10,854,578 | B2 | 12/2020 | Morein |
| 10,879,212 | B2 | 12/2020 | Uzoh et al. |
| 10,886,177 | B2 | 1/2021 | DeLaCruz et al. |
| 10,892,246 | B2 | 1/2021 | Uzoh |
| 10,923,408 | B2 | 2/2021 | Huang et al. |
| 10,923,413 | B2 | 2/2021 | DeLaCruz |
| 10,950,547 | B2 | 3/2021 | Mohammed et al. |
| 10,964,664 | B2 | 3/2021 | Mandalapu et al. |
| 10,985,133 | B2 | 4/2021 | Uzoh |
| 10,991,804 | B2 | 4/2021 | DeLaCruz et al. |
| 10,998,292 | B2 | 5/2021 | Lee et al. |
| 11,004,757 | B2 | 5/2021 | Katkar et al. |
| 11,011,494 | B2 | 5/2021 | Gao et al. |
| 11,011,503 | B2 | 5/2021 | Wang et al. |
| 11,031,285 | B2 | 6/2021 | Katkar et al. |
| 11,037,919 | B2 | 6/2021 | Uzoh et al. |
| 11,056,348 | B2 | 7/2021 | Theil |
| 11,069,734 | B2 | 7/2021 | Katkar |
| 11,088,099 | B2 | 8/2021 | Katkar et al. |
| 11,127,628 | B1 * | 9/2021 | Shih ........................ H01L 25/50 |
| 11,127,632 | B1 * | 9/2021 | Shih .................... H01L 23/5226 |
| 11,127,738 | B2 | 9/2021 | DeLaCruz et al. |
| 11,158,573 | B2 | 10/2021 | Uzoh et al. |
| 11,158,606 | B2 | 10/2021 | Gao et al. |
| 11,169,326 | B2 | 11/2021 | Huang et al. |
| 11,171,117 | B2 | 11/2021 | Gao et al. |
| 11,176,450 | B2 | 11/2021 | Teig et al. |
| 11,195,748 | B2 | 12/2021 | Uzoh et al. |
| 11,205,625 | B2 | 12/2021 | DeLaCruz et al. |
| 11,211,362 | B2 * | 12/2021 | Huang .................. H01L 23/481 |
| 11,244,920 | B2 | 2/2022 | Uzoh |
| 11,256,004 | B2 | 2/2022 | Haba et al. |
| 11,264,357 | B1 | 3/2022 | DeLaCruz et al. |
| 11,276,676 | B2 | 3/2022 | Enquist et al. |
| 11,296,044 | B2 | 4/2022 | Gao et al. |
| 11,329,034 | B2 | 5/2022 | Tao et al. |
| 11,348,898 | B2 | 5/2022 | DeLaCruz et al. |
| 11,355,404 | B2 | 6/2022 | Gao et al. |

(56) References Cited

U.S. PATENT DOCUMENTS

| | | | | |
|---|---|---|---|---|
| 11,355,443 | B2 | 6/2022 | Huang et al. | |
| 11,367,652 | B2 | 6/2022 | Uzoh et al. | |
| 11,373,963 | B2 | 6/2022 | DeLaCruz et al. | |
| 11,380,597 | B2 | 7/2022 | Katkar et al. | |
| 11,385,278 | B2 | 7/2022 | DeLaCruz et al. | |
| 11,387,202 | B2 | 7/2022 | Haba et al. | |
| 11,387,214 | B2 | 7/2022 | Wang et al. | |
| 11,393,779 | B2 | 7/2022 | Gao et al. | |
| 11,462,419 | B2 | 10/2022 | Haba | |
| 11,476,213 | B2 | 10/2022 | Haba et al. | |
| 11,817,306 | B2 * | 11/2023 | Huang | H01L 25/50 |
| 2004/0084414 | A1 | 5/2004 | Sakai et al. | |
| 2005/0116333 | A1 | 6/2005 | Akiyama et al. | |
| 2006/0057945 | A1 | 3/2006 | Hsu et al. | |
| 2007/0111386 | A1 | 5/2007 | Kim et al. | |
| 2009/0039467 | A1 | 2/2009 | Chinthakindi et al. | |
| 2011/0049724 | A1 | 3/2011 | Anderson et al. | |
| 2011/0177672 | A1 | 7/2011 | Watanabe et al. | |
| 2013/0200482 | A1 | 8/2013 | Fang et al. | |
| 2014/0175655 | A1 | 6/2014 | Chen et al. | |
| 2014/0264948 | A1 * | 9/2014 | Chou | H01L 24/83 438/109 |
| 2015/0064498 | A1 | 3/2015 | Tong | |
| 2015/0348943 | A1 | 12/2015 | Chen et al. | |
| 2016/0343613 | A1 | 11/2016 | Uzoh | |
| 2016/0343682 | A1 | 11/2016 | Kawasaki | |
| 2017/0069578 | A1 | 3/2017 | Montgomery | |
| 2017/0069593 | A1 | 3/2017 | Chou et al. | |
| 2018/0047688 | A1 | 2/2018 | Ho et al. | |
| 2018/0158749 | A1 | 6/2018 | Yu et al. | |
| 2018/0175012 | A1 | 6/2018 | Wu et al. | |
| 2018/0182639 | A1 | 6/2018 | Uzoh et al. | |
| 2018/0182666 | A1 | 6/2018 | Uzoh et al. | |
| 2018/0190580 | A1 | 7/2018 | Haba et al. | |
| 2018/0190583 | A1 | 7/2018 | DeLaCruz et al. | |
| 2018/0219038 | A1 | 8/2018 | Gambino et al. | |
| 2018/0323177 | A1 | 11/2018 | Yu et al. | |
| 2018/0323227 | A1 | 11/2018 | Zhang et al. | |
| 2018/0331066 | A1 | 11/2018 | Uzoh et al. | |
| 2019/0115277 | A1 | 4/2019 | Yu et al. | |
| 2019/0131277 | A1 | 5/2019 | Yang et al. | |
| 2019/0333550 | A1 | 10/2019 | Fisch | |
| 2019/0385935 | A1 | 12/2019 | Gao et al. | |
| 2020/0013765 | A1 | 1/2020 | Fountain, Jr. et al. | |
| 2020/0035641 | A1 | 1/2020 | Fountain, Jr. et al. | |
| 2020/0075553 | A1 | 3/2020 | DeLaCruz et al. | |
| 2020/0294908 | A1 | 9/2020 | Haba et al. | |
| 2020/0328162 | A1 | 10/2020 | Haba et al. | |
| 2020/0395321 | A1 | 12/2020 | Katkar et al. | |
| 2020/0411483 | A1 | 12/2020 | Uzoh et al. | |
| 2021/0020601 | A1 * | 1/2021 | Chen | H01L 23/3185 |
| 2021/0057328 | A1 | 2/2021 | Lee et al. | |
| 2021/0098412 | A1 | 4/2021 | Haba et al. | |
| 2021/0118864 | A1 | 4/2021 | DeLaCruz et al. | |
| 2021/0143109 | A1 | 5/2021 | Cho et al. | |
| 2021/0143125 | A1 | 5/2021 | DeLaCruz et al. | |
| 2021/0181510 | A1 | 6/2021 | Katkar et al. | |
| 2021/0193603 | A1 | 6/2021 | DeLaCruz et al. | |
| 2021/0193624 | A1 | 6/2021 | DeLaCruz et al. | |
| 2021/0193625 | A1 | 6/2021 | Katkar et al. | |
| 2021/0242152 | A1 | 8/2021 | Fountain, Jr. et al. | |
| 2021/0280560 | A1 * | 9/2021 | Huang | H01L 24/08 |
| 2021/0287937 | A1 | 9/2021 | Shih | |
| 2021/0296282 | A1 | 9/2021 | Gao et al. | |
| 2021/0296283 | A1 | 9/2021 | Huang et al. | |
| 2021/0305202 | A1 | 9/2021 | Uzoh et al. | |
| 2021/0305208 | A1 * | 9/2021 | Huang | H01L 21/76835 |
| 2021/0358808 | A1 | 11/2021 | Lu et al. | |
| 2021/0366820 | A1 | 11/2021 | Uzoh | |
| 2021/0375900 | A1 * | 12/2021 | Zhang | H10B 41/35 |
| 2021/0407941 | A1 | 12/2021 | Haba | |
| 2022/0013401 | A1 | 1/2022 | Wirz et al. | |
| 2022/0037268 | A1 | 2/2022 | Shen et al. | |
| 2022/0077063 | A1 | 3/2022 | Haba | |
| 2022/0077087 | A1 | 3/2022 | Haba | |
| 2022/0139867 | A1 | 5/2022 | Uzoh | |
| 2022/0139869 | A1 | 5/2022 | Gao et al. | |
| 2022/0199559 | A1 * | 6/2022 | Fang | H01L 24/82 |
| 2022/0208650 | A1 | 6/2022 | Gao et al. | |
| 2022/0208702 | A1 | 6/2022 | Uzoh | |
| 2022/0208723 | A1 | 6/2022 | Katkar et al. | |
| 2022/0216167 | A1 * | 7/2022 | Yang | H01L 24/80 |
| 2022/0246497 | A1 | 8/2022 | Fountain, Jr. et al. | |
| 2022/0262751 | A1 * | 8/2022 | Zhang | H01L 25/03 |
| 2022/0285303 | A1 | 9/2022 | Mirkarimi et al. | |
| 2022/0293557 | A1 | 9/2022 | Hsu et al. | |
| 2022/0319901 | A1 | 10/2022 | Suwito et al. | |
| 2022/0320035 | A1 | 10/2022 | Uzoh et al. | |
| 2022/0320036 | A1 | 10/2022 | Gao et al. | |
| 2022/0344301 | A1 * | 10/2022 | Yu | H01L 24/08 |
| 2022/0359601 | A1 * | 11/2022 | Tsai | H01L 23/528 |
| 2022/0416393 | A1 * | 12/2022 | Dogiamis | H01L 23/5384 |
| 2023/0005850 | A1 | 1/2023 | Fountain, Jr. | |
| 2023/0019869 | A1 | 1/2023 | Mirkarimi et al. | |
| 2023/0036441 | A1 | 2/2023 | Haba et al. | |
| 2023/0062465 | A1 * | 3/2023 | Clark | H01L 24/80 |
| 2023/0067677 | A1 | 3/2023 | Lee et al. | |
| 2023/0069183 | A1 | 3/2023 | Haba | |
| 2023/0100032 | A1 | 3/2023 | Haba et al. | |
| 2023/0187294 | A1 | 6/2023 | Lee et al. | |
| 2024/0170411 | A1 | 5/2024 | Chang et al. | |

FOREIGN PATENT DOCUMENTS

| | | |
|---|---|---|
| JP | 2013-033786 A | 2/2013 |
| JP | 2018-160519 | 10/2018 |
| WO | WO 2005/043584 A2 | 5/2005 |

OTHER PUBLICATIONS

Ker, Ming-Dou et al., "Fully process-compatible layout design on bond pad to improve wire bond reliability in CMOS Ics," IEEE Transactions on Components and Packaging Technologies, Jun. 2002, vol. 25, No. 2, pp. 309-316.

Moriceau, H. et al., "Overview of recent direct wafer bonding advances and applications," Advances in Natural Sciences—Nanoscience and Nanotechnology, 2010, 11 pages.

Nakanishi, H. et al., "Studies on SiO2—SiO2 bonding with hydrofluoric acid. Room temperature and low stress bonding technique for MEMS," Sensors and Actuators, 2000, vol. 79, pp. 237-244.

Oberhammer, J. et al., "Sealing of adhesive bonded devices on wafer level," Sensors and Actuators A, 2004, vol. 110, No. 1-3, pp. 407-412, see pp. 407-412, and Figures 1 (a)-1 (I), 6 pages.

Plobi, A. et al., "Wafer direct bonding: tailoring adhesion between brittle materials," Materials Science and Engineering Review Journal, 1999, R25, 88 pages.

Bush, Steve, "Electronica: Automotive power modules from on Semi," ElectronicsWeekly.com, indicating an Onsemi AR0820 product was to be demonstrated at a Nov. 2018 trade show, https://www.electronicsweekly.com/news/products/power-supplies/electronica-automotive-power-modules-semi-2018-11/ (published Nov. 8, 2018; downloaded Jul. 26, 2023).

Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.

Onsemi AR0820 image, cross section of a CMOS image sensor product. The part in the image was shipped on Sep. 16, 2021. Applicant makes no representation that the part in the image is identical to the part identified in the separately submitted reference Bush, Nov. 8, 2018, ElectronicsWeekly.com ("Bush article"); however, the imaged part and the part shown in the Bush article share the part number "Onsemi AR0820.".

Sony IMX260 images, showing various cross sections and materials analyses for a hybrid bonded back side illuminated CMOS image sensor. The part in the images was shipped in Apr. 2016. Applicant makes no representation that the part in the images is identical to the part identified in the separately submitted reference Morrison et al.

(56) References Cited

OTHER PUBLICATIONS (Tech Insights article dated Apr. 24, 2016), describing and showing a similar sensor product within the Samsung Galaxy S7; however the imaged part and the part shown in the Morrison et al. article share the part name "Sony IMX260 image." (8 pages).
European Extended Search Report dated Oct. 10, 2025 for Application No. 22884295.1, 8 pages.
Korean Office Action, re KR Application No. 10-2024-7016260, dated Jun. 4, 2026.

* cited by examiner

REDUCED PARASITIC CAPACITANCE IN BONDED STRUCTURES

CROSS REFERENCE TO RELATED APPLICATION

This patent application claims the benefit of U.S. Provisional Application No. 63/257,035, filed Oct. 18, 2021. The content of the provisional application is hereby incorporated by reference in its entirety.

BACKGROUND

Field

The field relates to microelectronics with directly bonded elements.

Description of the Related Art

Microelectronic elements, such as dies and wafers prior to separation between the dies, can be directly bonded to one another. The direct bonds can be between dielectric materials of the bonded elements and can also include conductive materials at or near the bond interface for direct hybrid bonding, such as DBI® connection commercially available from Adeia of San Jose, CA. The conductive materials at the bonding interface may be bonding pads formed in or over a redistribution layer (RDL) over a die or wafer, and/or passive electronic components, such as capacitors, resistors, and inductors that can play a role in transforming signals within the microelectronic element.

Conductive features in integrated devices may be tightly packed and spaced apart by dielectrics, resulting in parasitic capacitance. Parasitic capacitance may cause unwanted power loss consumption, undesired coupling and crosstalk especially in high frequency circuits. Accordingly, there remains a continuing need for improved design of passive features in microelectronic elements that minimizes or eliminates undesirable losses in signal integrity.

BRIEF DESCRIPTION OF THE DRAWINGS

Specific implementations will now be described with reference to the following drawings, which are provided by way of example, and not limitation.

DETAILED DESCRIPTION

Disclosed herein are microelectronic devices with reduced inductive and parasitic capacitance between conductive features at or near bonding interfaces, and methods of forming such devices. In one example, disclosed devices and methods use isolation features or spacers to reduce parasitic coupling between conductive features. Nonlimiting advantages of such devices having lower parasitic capacitance include improved power consumption at matched performance, reduced antenna issues, reduced crosstalk, and lower leakage currents and higher power efficiency. Furthermore, using isolation spacers to achieve reduced parasitic capacitance allows the conductive features to be closely packed and achieve a small pitch of features.

Figure 1:
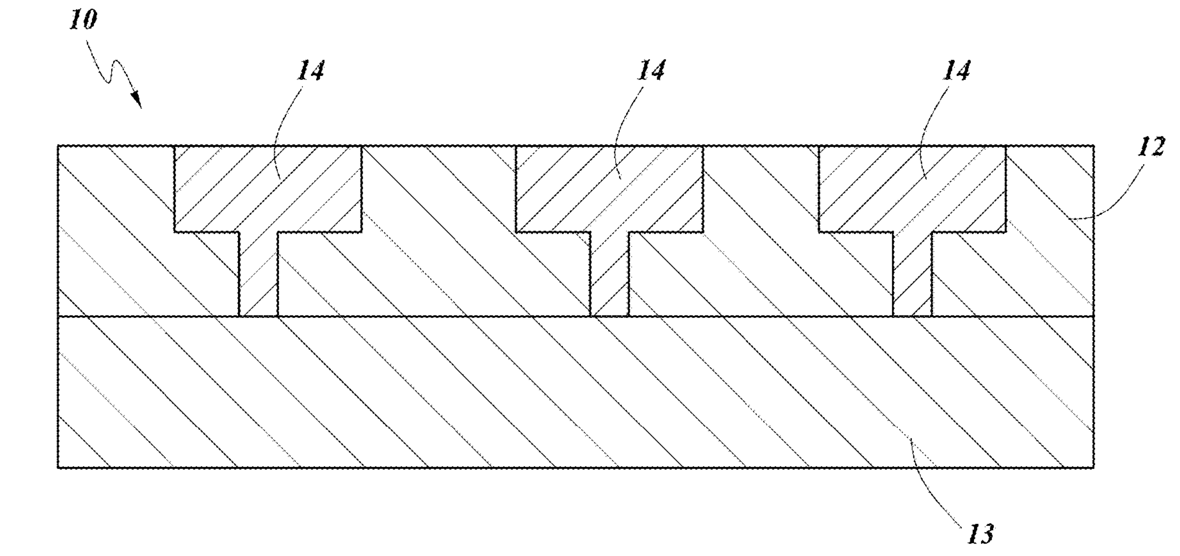
FIG. 1 is a schematic cross-sectional view of a first element 10 having a plurality of first conductive features 14 embedded in a first insulating layer 12, according to an embodiment.

For example, FIG. 1 is a schematic cross-sectional view of a semiconductor element comprising an integrated device die or wafer at a stage of a fabrication process. FIG. 1 illustrates a first element 10 as part of a microelectronic device. As shown in FIG. 1, at least two first conductive features 14, e.g., contact pads, can be formed in a direct bonding layer of the first element 10. Although the conductive features 14 shown in FIG. 1 comprise contact pads (or bond pads), in some embodiments, the conductive contact features can comprise TSVs (through-substrate vias), portions of a capacitor/inductor, etc. The first conductive features 14 may be embedded in a first insulating layer or dielectric material, or a BEOL layer 12, which is formed on a semiconductor layer 13. In some embodiments, the insulating layer 12 that is suitable for direct bonding may be formed in or over a redistribution layer (RDL), which can be formed prior to dicing a wafer or over a reconstituted wafer after dicing and filling spaces between dies. The first conductive features 14 may be near or at a surface of the first element 10. In one example, the two or more first conductive features 14 can comprise or form part of a plurality of capacitor structures, e.g., metal plates, formed in damascene cavities in the first insulating layer 12 of the first element 10.

Figure 2:
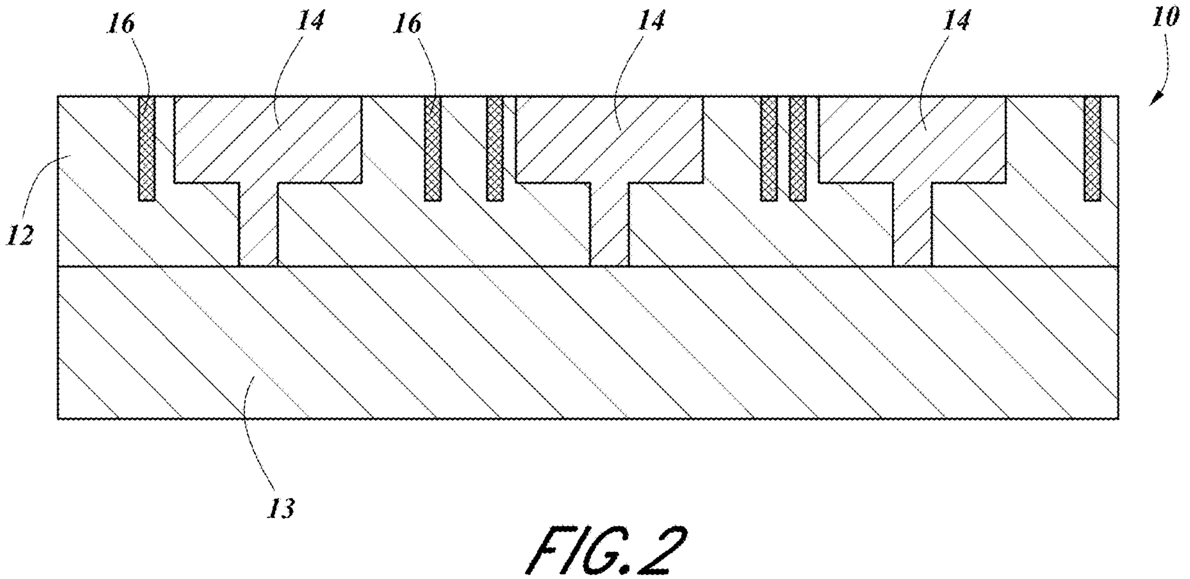
FIG. 2 is a schematic cross-sectional view of the first element 10 having first isolation features 16 formed between the first conductive features 14 and in the first insulating layer 12.

FIG. 2 is a schematic cross-sectional view of the first element 10 in FIG. 1 (for example, after the step of FIG. 1), illustrating that first isolation features or spacers 16 are formed in the first element 10. The isolation features 16 can be disposed between adjacent first conductive features 14, and may be disposed at least partially around the first conductive features 14, e.g., capacitor structures, at or near the surface of the first element 10. The process of forming the first isolating features 16 may include etching trenches into the insulating layer 12 to create voids. The voids may be filled or partially filled with a low dielectric constant, e.g., low-k dielectric, material that has a lower-k value compared to the surrounding (structural) first insulating layer 12 in which the voids are formed. For example, if the surrounding first insulating layer 12 comprises silicon oxide with a dielectric constant of about 3.6, the material of the first isolation features 16 can have a dielectric constant below that of silicon oxide, e.g., less than 3.5, or less than 3. As is known in the art, such low-k materials include porous silicon oxide, fluorine-doped silicon oxide, organosilicate glass, polymeric materials and air or an inert gas (gas-filled voids). The surrounding first insulating layer 12 is suitable for direct bonding and has sufficient structural integrity to withstand polishing, which the low-k dielectric materials may not have if used by itself as the bonding layer. Example materials for the first insulating layer 12 may include silicon oxide, silicon nitride, silicon oxynitride, silicon carbide, silicon oxycarbonitride, silicon carbonitride, ceramics, glass-ceramics or diamond-like carbon. Forming the first isolating layers 16 between the first conductive features 14 in the first element 10 can reduce the parasitic capacitance between the first conductive features 14 in the first element 10. The surface of the bonding layer may be prepared for direct bonding, including one or more of planarizing, activating and terminating processes that are described herein. In various embodiments, the bonding layer can be prepared for direct bonding after the step of forming the first isolating layer 16.

Figure 3:
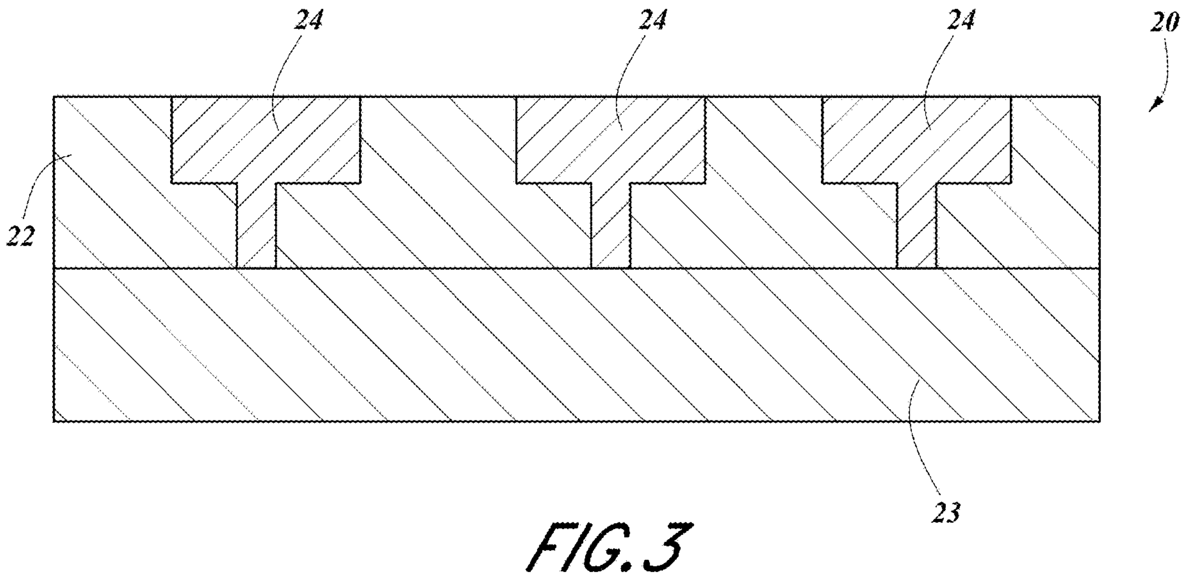
FIG. 3 is a schematic cross-sectional view of a second element 20 having a plurality of second conductive features 24 embedded in a second insulating layer 22.

Referring to FIG. 3, a schematic cross-sectional view of a second element 20 at a stage of processing is illustrated. Similar to the first element 10 shown in FIG. 1, the second element 20 at the stage has at least two second conductive features 24, e.g., TSVs, bond pads, capacitor plates, inductor wiring, etc. The second conductive features 24 may be embedded in a second insulating or dielectric layer 22 suitable for direct bonding, and the dielectric layer or BEOL layer 22 may be formed on another dielectric layer or semiconductor layer 23. The second conductive features 24 may be at or near a surface of the second element 20. In one example, the second conductive features can comprise or form a part of capacitor structures, e.g., metal plates, formed in damascene cavities in the second insulating layer 22 of the second element 20.

Figure 4:
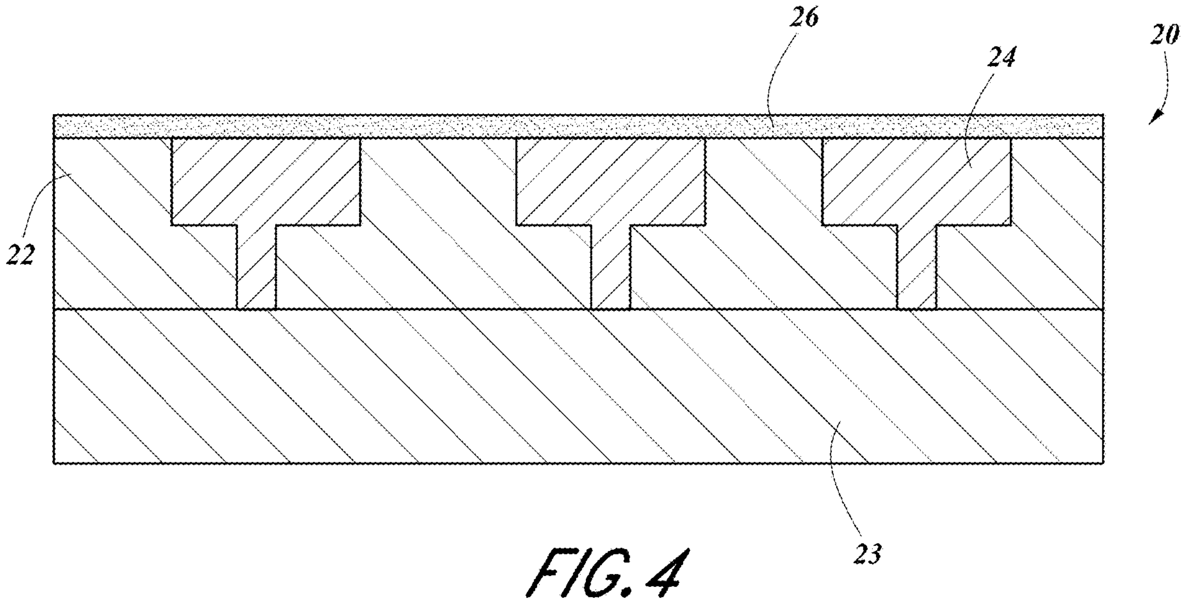
FIG. 4 is a schematic cross-sectional view of the second element 20 showing a thin third insulating layer 26 grown on the top surface of the second element 20 capping the second conductive features 24 and the surrounding second insulating layer 22.

Proceeding to FIG. 4, a third thin film insulating layer 26 (which can comprise or serve as a capacitor dielectric layer) is formed, e.g., deposited, on the top surface of the second element 20 shown in FIG. 3, capping the second conductive features 24 and the surrounding second insulating layer 22. The third insulating layer 26 may be formed of a high dielectric constant material, e.g., having a dielectric constant above that of silicon oxide. The dielectric constant may be greater than 4, such as for silicon nitride or silicon oxynitride, or can be higher than 10 or 20, such as for metal oxides like zirconium oxide, hafnium oxide, barium titanate (BT), strontium bismuth tantalate (SBT), etc. The third insulating layer 26 may be relatively thin, e.g., in a range of about 20-100 nm, or can be up to several microns in thickness. The third insulating layer 26 may be substantially thinner than the thickness of the first element 10 or the second element 20.

Figure 5:
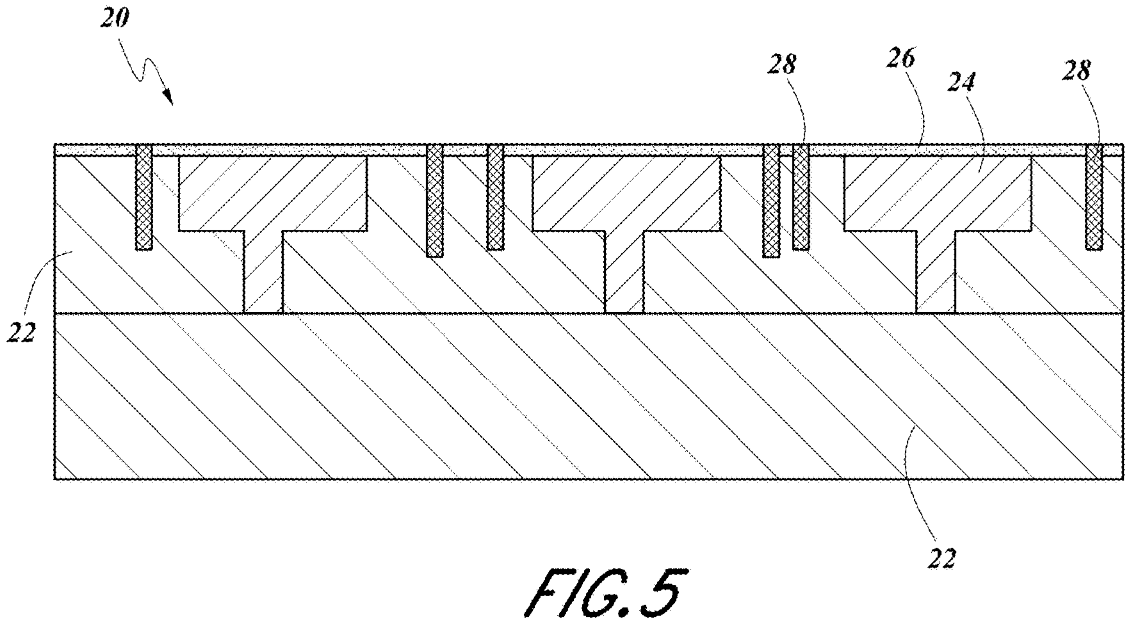
FIG. 5 is a schematic cross-sectional view of the second element 20 having second isolation features 28 formed between the second conductive features 24 and through the third insulating layer 26 and into the second insulating layer 22.

Similar to the first element 10 shown in FIG. 2, the second element 20 is illustrated in FIG. 5 to have second isolation features or isolating spacers 28 formed therein. As shown in FIG. 5 the second isolation features 28 are formed through the third insulating layer 26 and into the second insulating layer 22. The second isolation features 28 can be disposed between adjacent second conductive features 24, and may be disposed at least partially around the second conductive features 24, e.g., capacitor structures, at or near the surface of the second element 20. The steps of forming the second isolation features 28 may include etching trenches through the third insulating layer 26 and partially into the second insulating layer 22 to create voids. Then the voids may be filled or partially filled with a low dielectric constant material, i.e., material having a dielectric constant below that of the surrounding structural second insulating layer 22, as described above. Forming the second isolation features 28 between the second conductive features 24 in the second element 20 can reduce the parasitic capacitance between the conductive features 24 in the second element 20.

Figure 6:
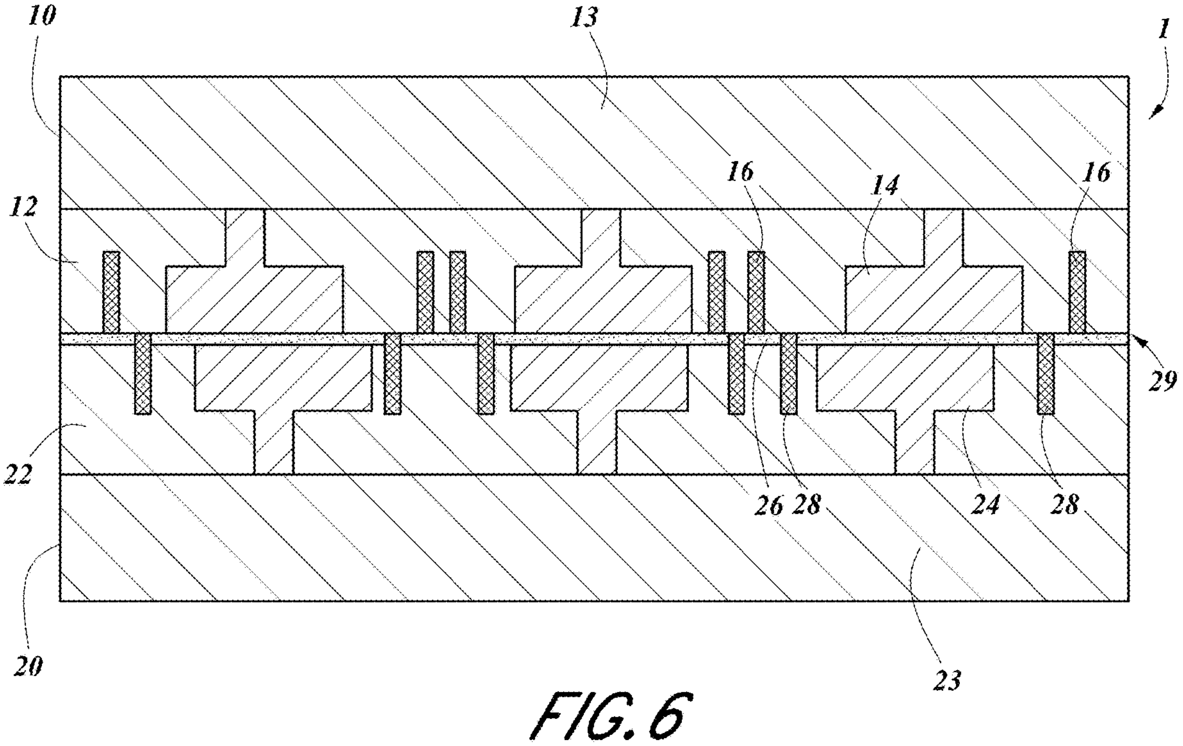
FIG. 6 is a schematic cross-sectional view illustrating the first element 10 and the second element 20 bonded together forming electronic device 1 by a direct bonding process.

After the first element 10 and the second element 20 are formed as shown in FIGS. 1-5, the two elements can be bonded, e.g., by way of a direct bonding process, to create a bonded structure or a microelectronic device 1, as shown in schematic cross-sectional view in FIG. 6. For example, the surface of the first element 10 which is near or at the capacitor structures is bonded to the third insulating layer 26 on the second element 20. As illustrated in the example, at a bonding interface 29 the first conductive features 14 in the first element 10 can be aligned with the second conductive features 24 in the second element 20. In other words, the first insulating layer 12 of the first element 10 is bonded to the third insulating layer 26 of the second element 20 while elsewhere direct conductor-conductor bonds can be formed (not shown). In the illustrated example, capacitors can be formed at the bonding interface, while elsewhere on the substrate's direct conductor-conductor bonds can be formed (not shown). Accordingly, as shown in FIG. 6, in both the first element 10 and the second element 20 of the bonded structure of the electronic device 1 the isolation features 16 and 28 are disposed between the conductive features 14 and 24, respectively, to reduce parasitic capacitance.

Figure 7:
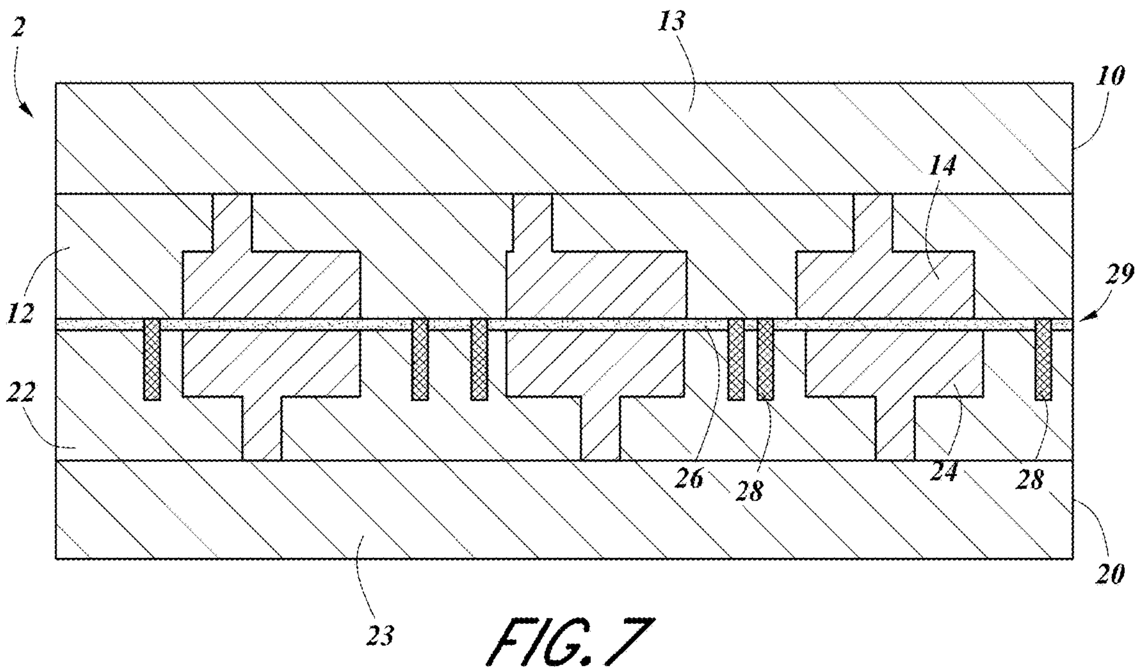
FIG. 7 is a schematic cross-sectional view illustrating a bonded electronic device 2 having isolation features in the second element 20 but not in the first element 10.

Depending on which element of the bonded structure causes more parasitic capacitance, one of the bonded elements may not utilize isolation features. FIG. 7 schematically illustrates a cross-sectional view of an example directly bonded electronic device 2 where only the second element 20 has the isolation features 28. In the figure, the first element 10 remains at the state shown in FIG. 1 without isolation features. In the case of device 2 in FIG. 7, analysis may indicate that without isolation features parasitic capacitance primarily occurs in the second element 20 and not as much in the first element 10. Therefore, isolation features 28 are formed in element 20 to control parasitic capacitance, and good results may be achieved without isolation features in element 10.

Figure 8:
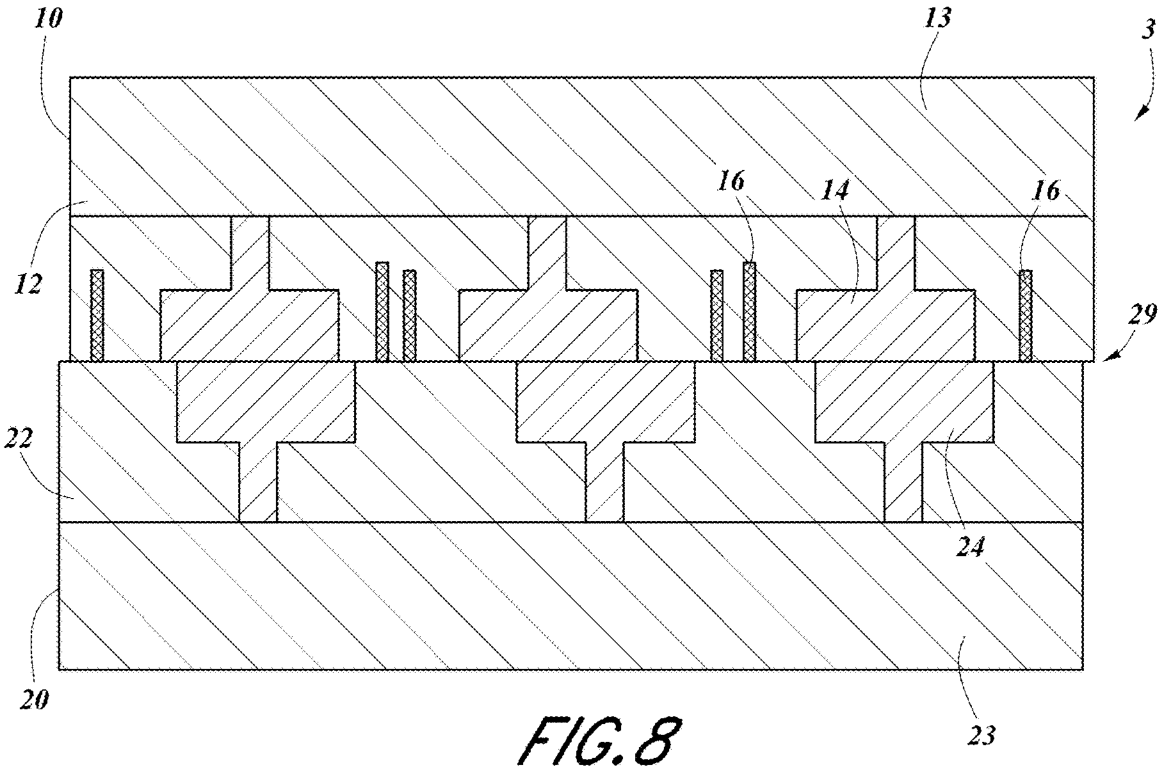
FIG. 8 is a schematic cross-sectional view illustrating that the bonded electronic device 3 has isolation features in the first element 10 but not in the second element 20, and without the intervening insulating layer at the bonding interface.

Another example embodiment is shown in FIG. 8, a schematic cross-sectional view illustrating that in a bonded electronic device 3 the first isolation features 16 are disposed in the first element 10 between the first conductive features 14 while the second element 20 may not include isolation features. This implementation can be used if analysis indicates that without isolation features parasitic capacitance primarily occurs in the first element 10. In some embodiments, as shown in FIG. 8, the electronic device 3 can be directly hybrid bonded without a third insulating layer at the bonding interface 29, e.g., such that the contact features 14 are directly bonded to the contact features 24 and such that the insulating layers 12, 22 are directly bonded to one another without adhesive. Accordingly, the embodiments disclosed herein can be utilized with capacitive electrical connections between opposing pads (e.g., FIGS. 6-7) or with direct conductive connections between opposing pads (e.g., FIG. 8).

In some embodiments, the capacitors formed at the bonding interface may comprise planar capacitors. In some embodiments, using isolation spacers to reduce parasitic capacitance may allow a higher density of conductive features, for example the spacing between capacitors may be smaller than a width of a capacitor. In some embodiments, the bonding process can be configured for room temperature, atmospheric pressure direct bonding, such as the ZIBOND®, DBI® and/or DBI® Ultra processes commercially available from Adeia of San Jose, CA.

Figure 9A:
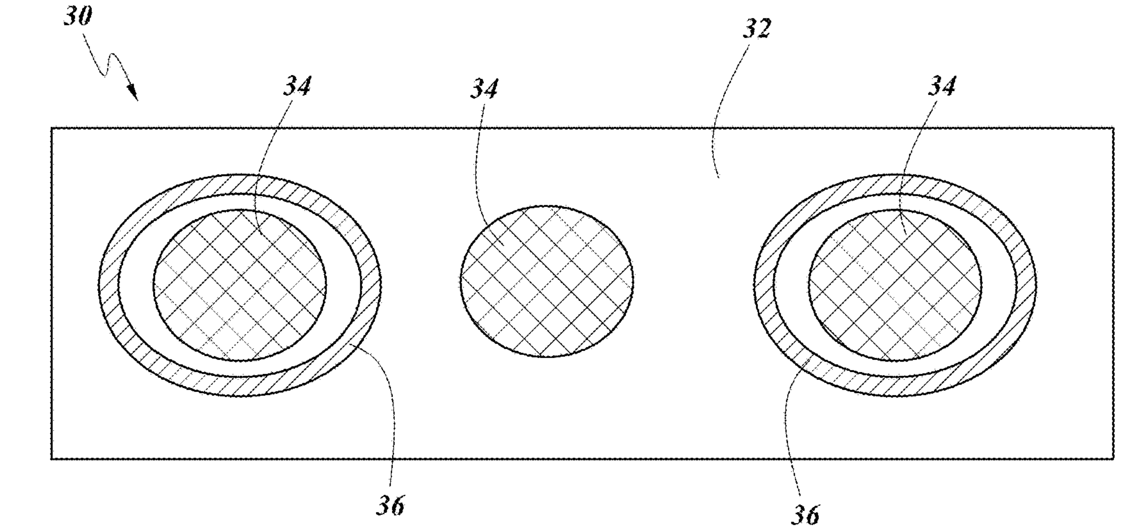
FIGS. 9A-9D are schematic top plan views of four example elements 30, 40, 50 and 90 illustrating different forms of isolation features disposed around conductive features at or near the bonding interfaces.
Figure 9B:
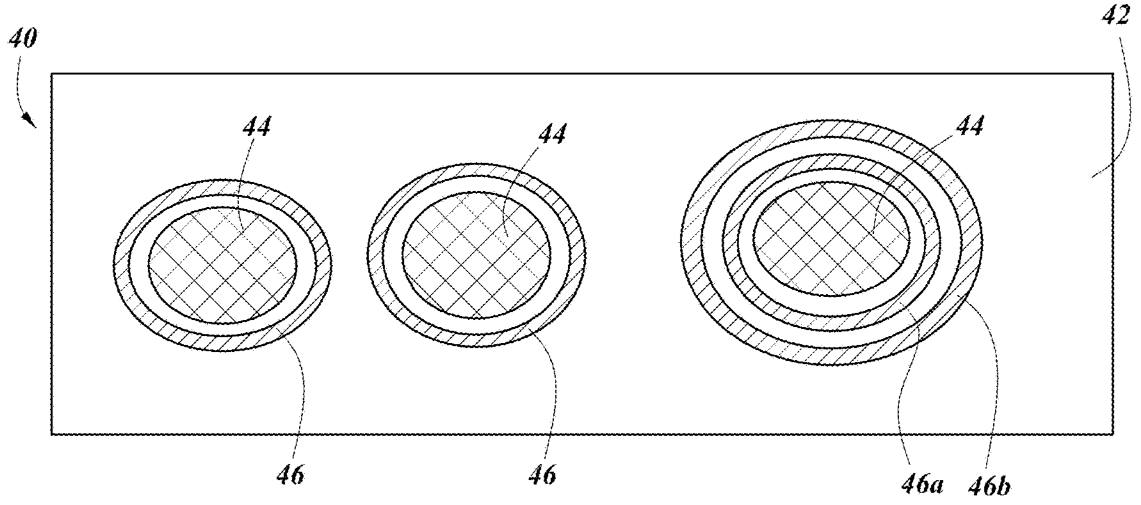
Figure 9C:
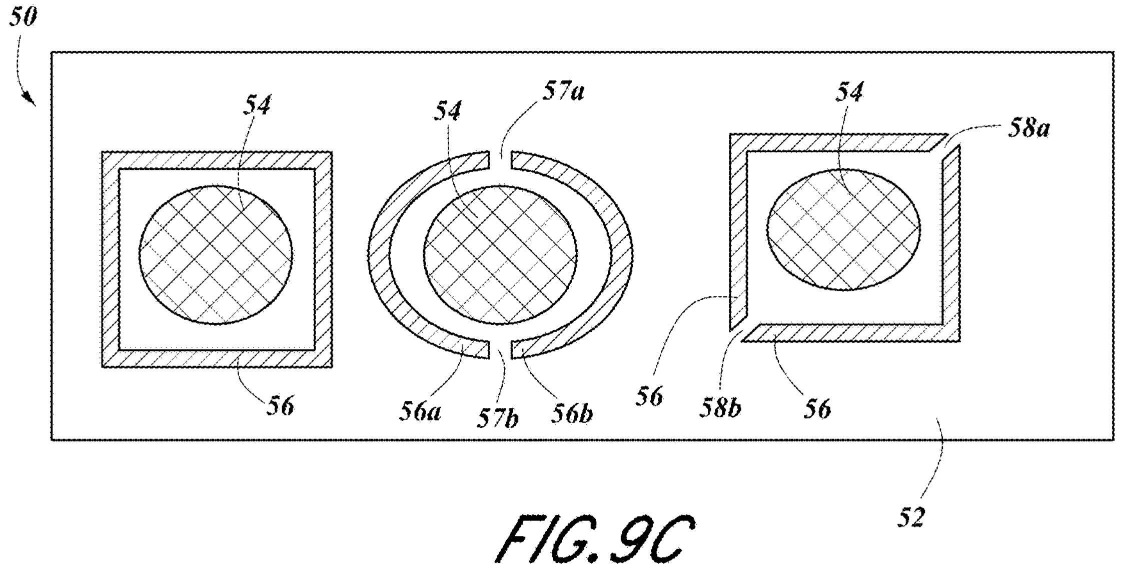
Figure 9D:
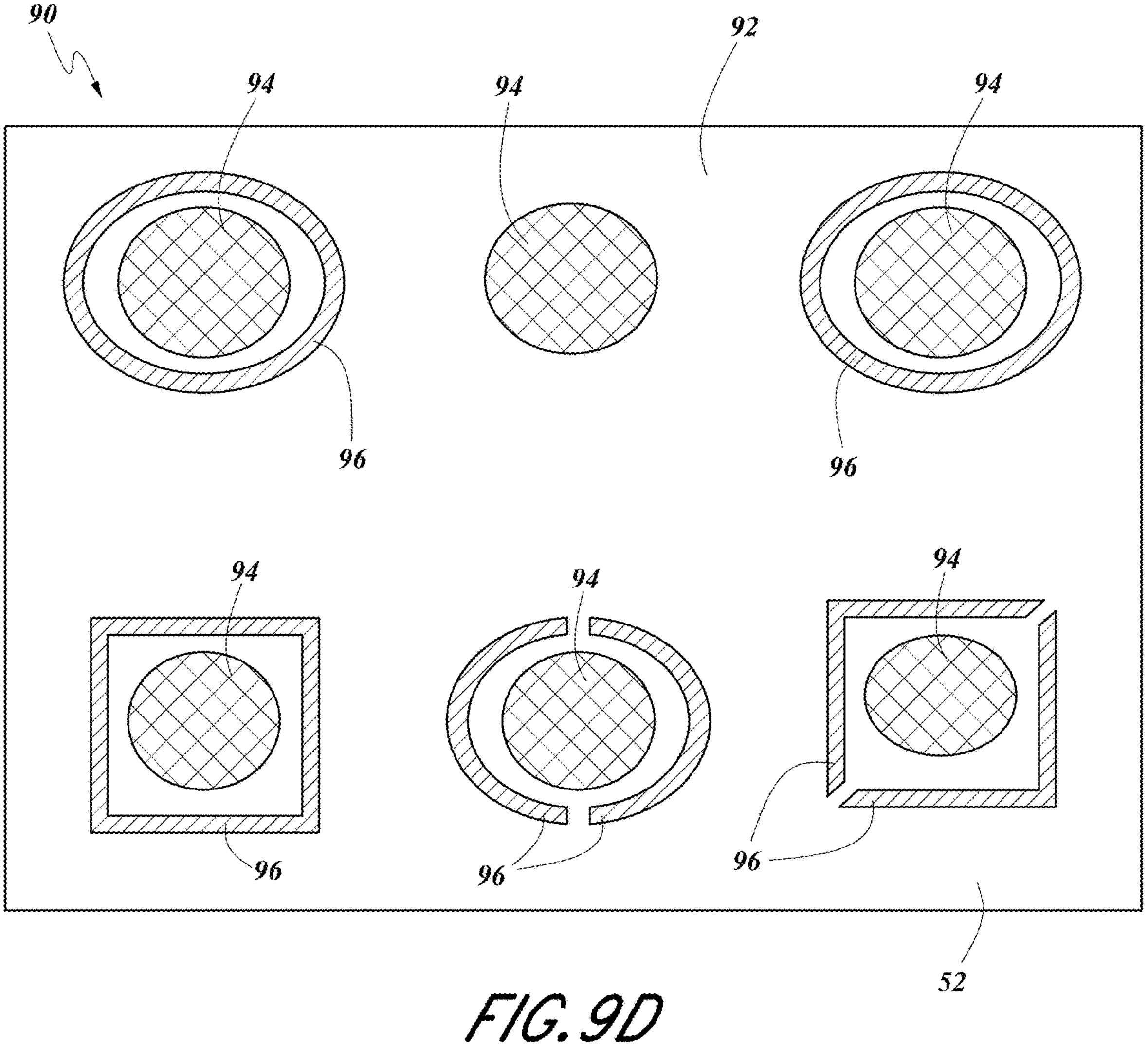

FIGS. 9A-9D are schematic plan views of four example elements, in which different forms of isolation features are disposed at least partially around conductive features 14 or 24 at the bonding interfaces 29 in FIGS. 6-8. Each of the example elements 30, 40 and 50 has a plurality of conductive features 34, 44 and 54, respectively, disposed approximately horizontally in the views. In FIG. 9D the conductive features 9D are disposed in two rows. In other embodiments, conductive features can have different arrangements. In each of the embodiments shown in FIG. 9A-9D, one or a plurality of effective annular isolation features 36, 46, 56 or 96 can at least partially surround the respective conductive features 34, 44, 54 and 94. In FIG. 9A, for example, the rounded (e.g., circular) isolation features 36 can be formed at least partially around (e.g., completely around) two of the three conductive features 34, e.g., the left-side feature and the right-side feature, but may not be formed around the center conductive feature 34. In some embodiments, the ringed or annular isolation features 36, although disposed only around the left-side and the right-side conductive features 34, may also isolate the center conductive feature 34. Additionally, or alternatively, in some arrangements, the center conductive feature 34 may not cause a significant amount of parasitic capacitance.

In FIG. 9B, the two conductive features 44 on the left-side can each be at least partially surrounded by a round (e.g., circular) isolation feature 46. In comparison, the conductive feature 44 on the right-side can be at least partially surrounded by a plurality of (e.g., two) round (e.g., circular) isolation features, including an inner isolation feature *46a* and an outer isolation feature *46b*. In some embodiments, multiple annular isolation features *46a* and *46b* are provided around the right-most conductive feature 44 may be because the conductive feature 44 on the right-side may cause more parasitic capacitance than the features 44 to the left side.

The isolation features 56 in FIG. 9C can have different shapes, e.g., polygonal or rounded. The isolation feature 56 at least partially surrounding the left-side conductive feature 54 can comprise a quadrilateral, e.g., a rectangular or square-shaped conductive feature 54. The isolation feature 56 at least partially surrounding the center conductive feature 54 can be rounded (e.g., circular), and can comprise a plurality of isolation feature segments including *56a* and *56b* spaced apart by one or more gaps *57a* and *57b*, one at the top side and the other at the bottom side. The isolation feature 56 at least partially surrounding the right-side conductive feature 54 can be polygonal, e.g., a quadrilateral such as a rectangular or square-shaped feature with two narrow openings, *58a* and *58b*, at two opposite corners.

In FIG. 9D, a plurality (e.g., six) conductive features 94 surrounded by isolation features 96 are illustrated by a schematic plan view. Similar to the isolation features illustrated in FIGS. 9A-9C above, in FIG. 9D each of the six conductive features 94 is individually surrounded or partially surrounded by its isolation feature 96, except for the conductive feature 94 at the top center position. As discussed above, the different isolation feature arrangements can be because of the nature of parasitic capacitance caused by the surrounded conductive features 94. Accordingly, it should be appreciated that, the isolation features disclosed herein may take different shapes (as seen from a top view) depending on the structure of the conductive features or other aspects of the parasitic capacitance or inductance to be isolated. Further, two or more isolation spacers may at least partially surround a conductive feature at or near the bonding interface 29. Moreover, the width of the isolation features can be any suitable width, e.g., in a range between 0.02 to 5 microns, and preferably between 0.05 to 2 microns.

Figure 10:
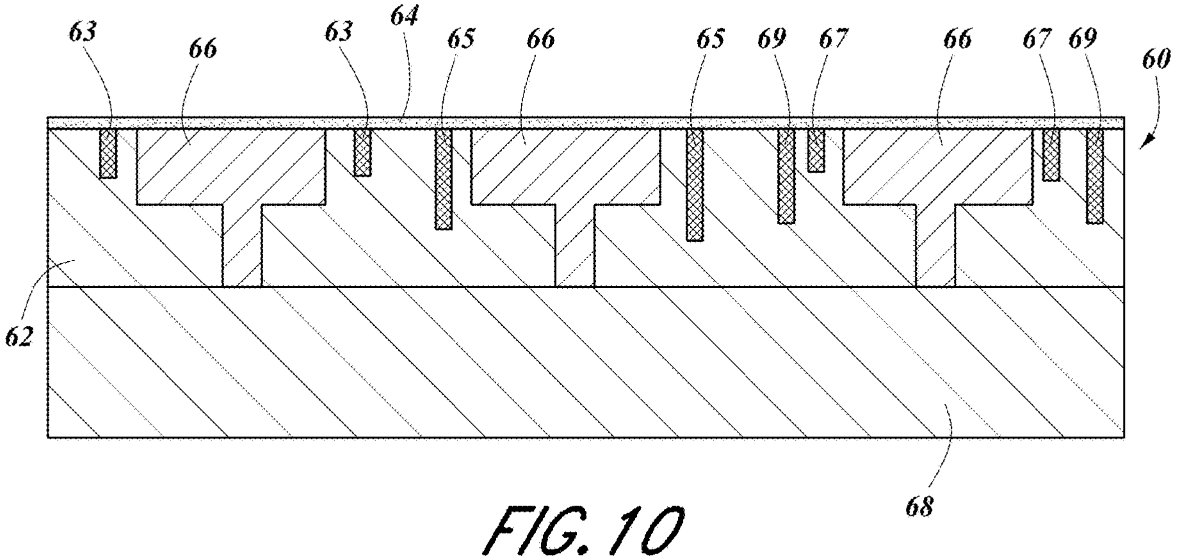
FIG. 10 is a schematic cross-sectional view of an element 60 illustrating isolation features having different depths separating or surrounding respective conductive features.

Referring to FIG. 10, a schematic cross-sectional view of an element 60 illustrates that isolation features 63, 65, 67 and 69 separating or surrounding conductive features 66 may have different depths. In FIG. 10, a plurality of conductive features 66 are disposed in a base insulating layer 62, which is formed on another dielectric layer 68. The top surface of the insulation layer 62 is covered by a top insulating layer 64, which in some embodiments can serve as the dielectric layer of a capacitor structure. The isolation features, 63, 65, 67 and 69 at least partially surrounding the respective conductive features 66 at or near the bonding interface have different depths. In one example, the depth of an isolation feature may be greater than 10% of the depth of an adjacent conductive feature, for example, preferably greater than 20% of the depth of a capacitor structure. On the other hand, the isolation features 65 near the conductive feature 66 at the center and the outer isolation feature 69 next to the conductive feature 66 on the right-side have depth approximately similar to the depth of their adjacent conductive features. In one example, two or more isolation features having different depths may be disposed at least partially around a given capacitor structure, like the ones surrounding the conductive feature 66 on the right-side in FIG. 10. Multiple spaced isolation features may perform better to intervene between adjacent conductive features for reduced parasitic capacitance.

Figure 11:
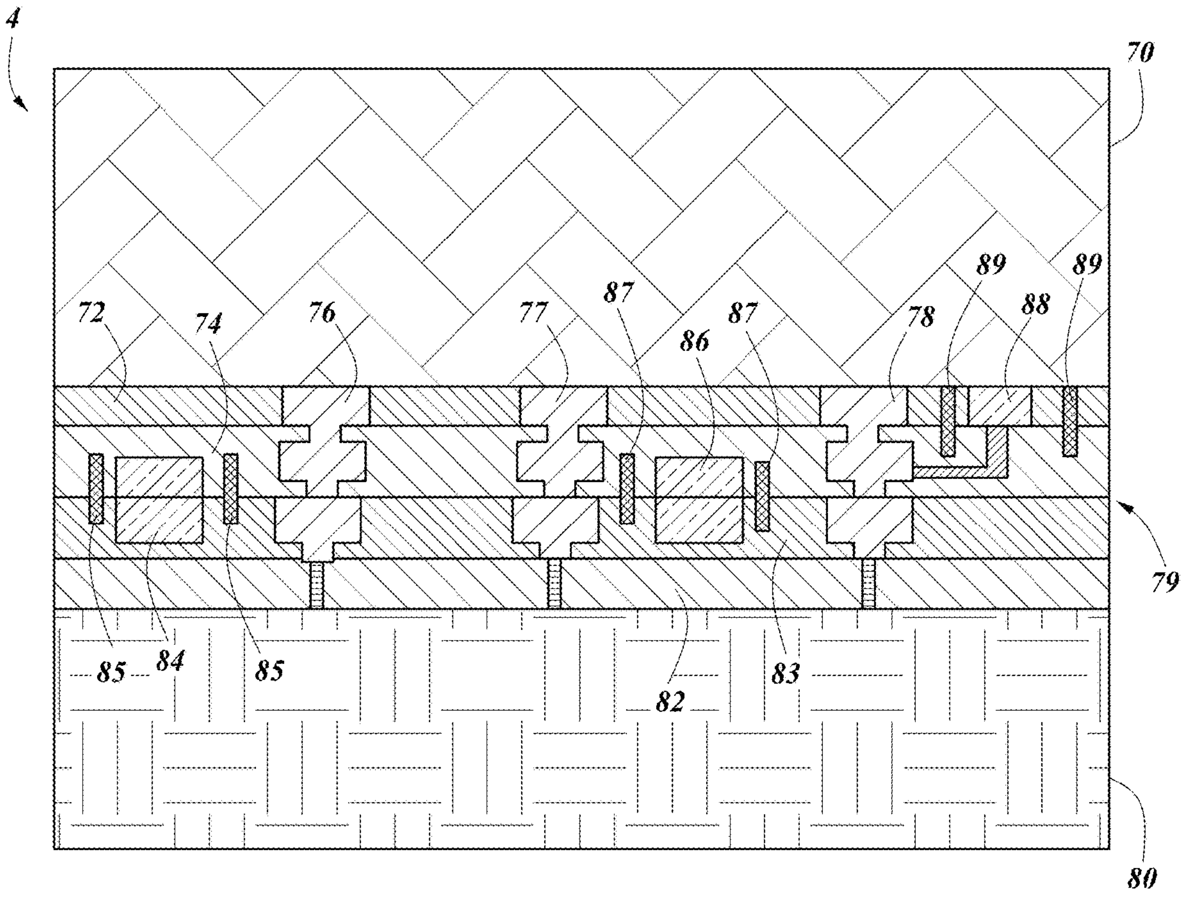
FIG. 11 is a schematic cross-sectional view of a bonded electronic device 4 comprising passive electronic components embedded in back-end-of-line (BEOL) layers surrounded by isolation features.

FIG. 11 is a schematic cross-sectional view of a bonded electronic device 4 comprising a semiconductor element 70, which may comprise a die, and another semiconductor element 80, which may comprise a wafer, an interposer, or another die, bonded at a bonding interface 79. When bonded, conductive features 76, 77 and 78 and passive electronic components 84, 86 and 88 can be disposed in insulating back end of line (BEOL) layers 72 and 74 in the element 70 and in insulating back end of line (BEOL) layers 82 and 83 in the element 80. The passive electronic components 84, 86 and 88 may comprise capacitors, inductors, and etc. In FIG. 11, an isolation feature 85 can be embedded near and at least partially surrounding the passive electronic component 84 across the bonding interface 79 in the BEOL layers of both the semiconductor elements 70 and 80. Similarly, an isolation feature 87 can be embedded near and at least partially surrounding the passive electronic component 86 in the BEOL layers. In other embodiments, passive electronic components 84, 86 can be formed upon bonding to span across the bonding interface 79. The isolation features 85 and 87 can be created the same way. Another isolation feature 89 can be formed near and at least partially surrounding the passive electronic component 88, which is disposed within the BEOL layers of the bonding element 70, e.g., at a location which may be away from the bonding interface 79.

Figure 12A:
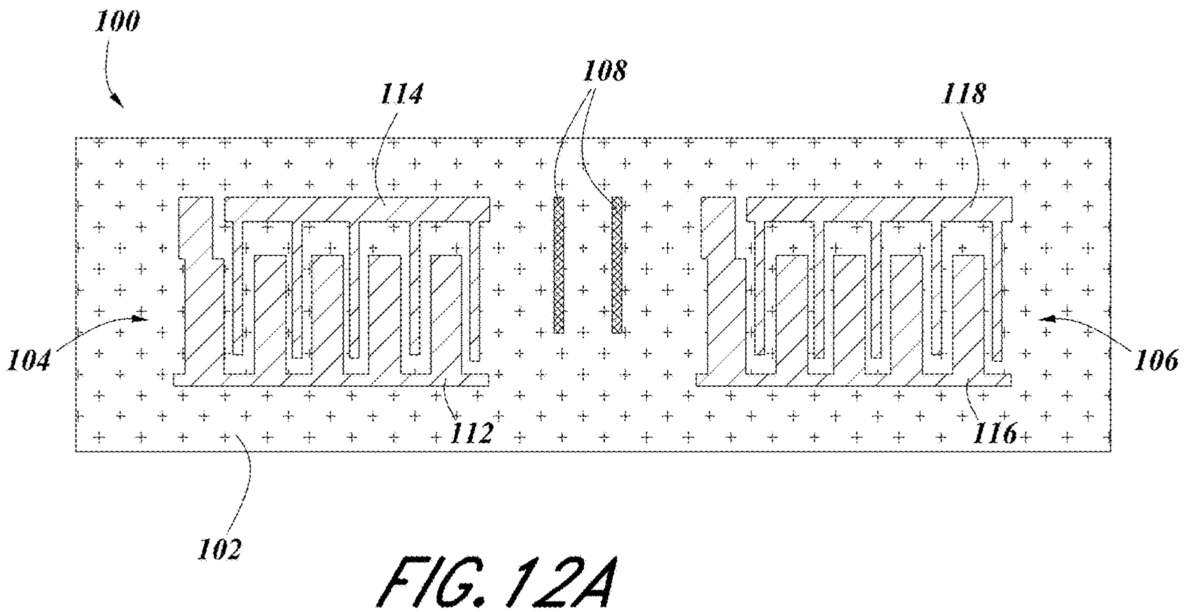
FIG. 12A is a schematic cross-sectional view of a semiconductor element 100 having one or more embedded three-dimensional (3D) capacitors separated by isolation features therebetween.

In various embodiments, the embedded passive electronic components formed at or near the bonding interface may be planar capacitors or three dimensional (3D) capacitors. FIG. 12A schematically illustrates a cross-sectional view of a semiconductor element 100. A first 3D capacitor 104 and a second 3D capacitor 106 are embedded in an insulating or dielectric material 102 suitable for direct bonding, and with two isolation features 108 as described hereinabove disposed between the two 3D capacitors. The first 3D capacitor 104 comprises a first electrode 112 and a second electrode 114, and the second 3D capacitor 106 comprises a third electrode 116 and a fourth electrode 118. Meanwhile, the insulating material 102 may serve as the capacitor dielectric intervening between the electrodes 112 and 114 for the first 3D capacitor 104 and between electrodes 116 and 118 for the second 3D capacitor 106. With isolation features 108 placed between the two adjacent 3D capacitors, the parasitic capacitance and other negative effects, including crosstalk, antenna effect, digital noise, reduced power efficiency, etc., between the two 3D capacitors can be significantly reduced.

Figure 12B:
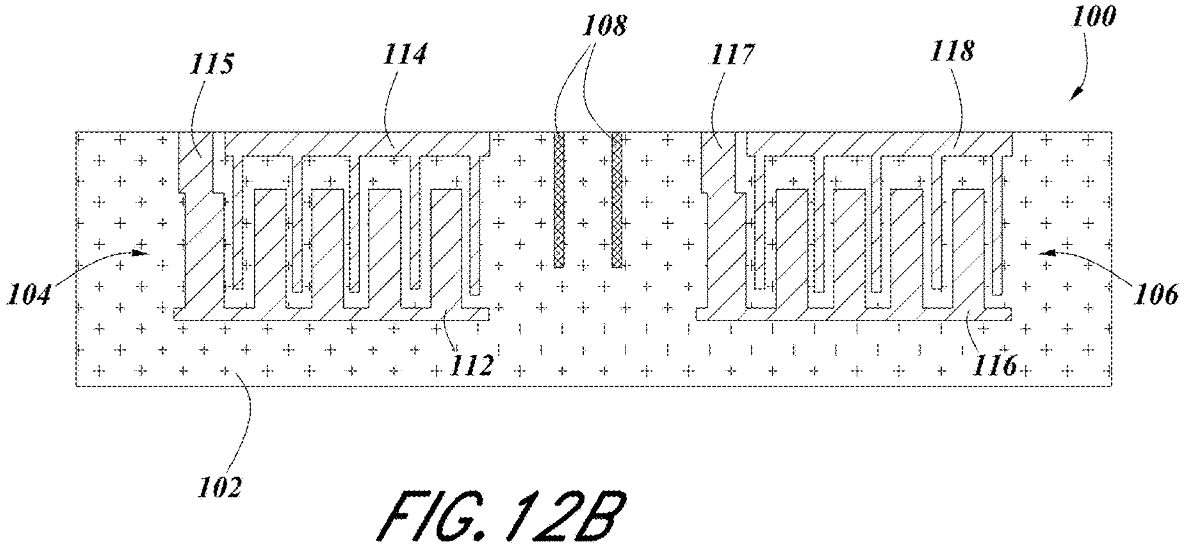
FIG. 12B is a schematic cross-sectional view of a semiconductor element 100 in FIG. 12A with top portions of the element planarized to expose contact pads and conductive materials prepared to be directly bonded with another element.

FIG. 12B shows that part of the top insulating material 102 can be removed by a planarization process, e.g., a chemical mechanical polishing, or CMP, process, to expose the contact pad 115 for the first electrode 112 and the upper conductive material of the second electrode 114 for the first 3D capacitor 104, and the contact pad 117 for the third electrode and the upper conductive material of the fourth electrode 118 for the second 3D capacitor 106. In this way, the semiconductor element 100 can be prepared to be directly bonded with another element, which may include direct hybrid bonding for contact pads and conductive materials at the substrate surface. Such contact pads may also connect with the internal connections for electrically connecting the 3D capacitors (indirectly) with conductive features of another element by direct hybrid bonding. And the lower capacitor plates can be internally interconnected (not shown), while the upper plates are prepared for directly bonding with conductive features of another element by direct hybrid bonding.

Figure 13A:
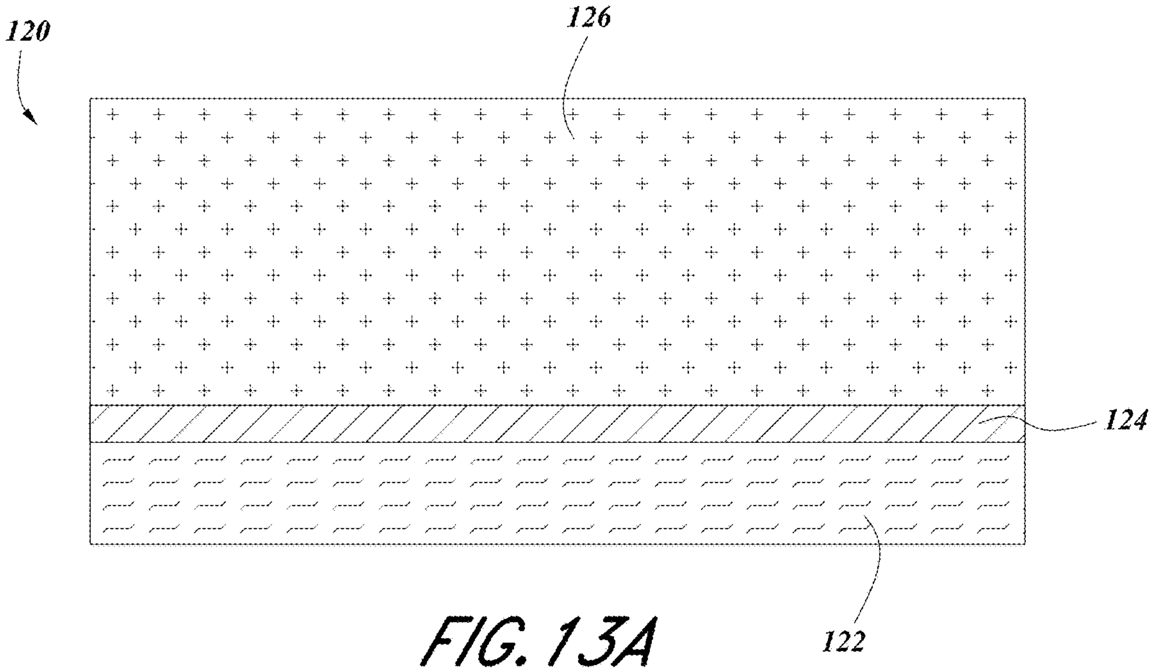
FIGS. 13A-13N are schematic cross-sectional views illustrating example processes to produce the 3D capacitor structures shown in FIG. 12A, according to various embodiments.
Figure 13B:
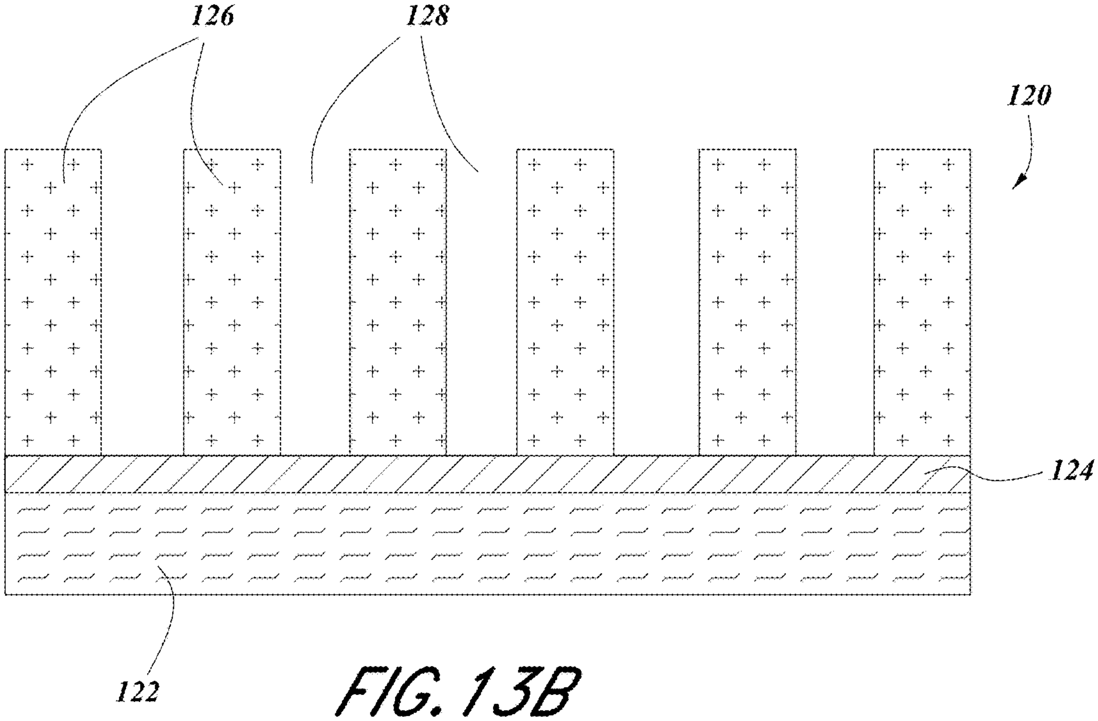

Example processes and methods for fabricating the 3D capacitors and isolation features shown in FIGS. 12A and 12B are illustrated in FIGS. 13A-13N, and FIGS. 14A-14N. In FIGS. 13A-13J, an example process is presented to form a 3D capacitor in or on an element 120 to be directly bonded to another element. FIG. 13A is a schematic cross-sectional view of the element 120 at a stage of fabrication, according to various embodiments. FIG. 13A illustrates coating a first dielectric layer 126 over a conductive layer 124 which is coupled to a base nonconductive layer 122 of the element 120. In FIG. 13B, the first dielectric layer 126 is illustrated to be selectively patterned, for example, by a reactive-ion etching (RIE) method, to form first cavities 128 in the first dielectric layer 126.

Figure 13C:
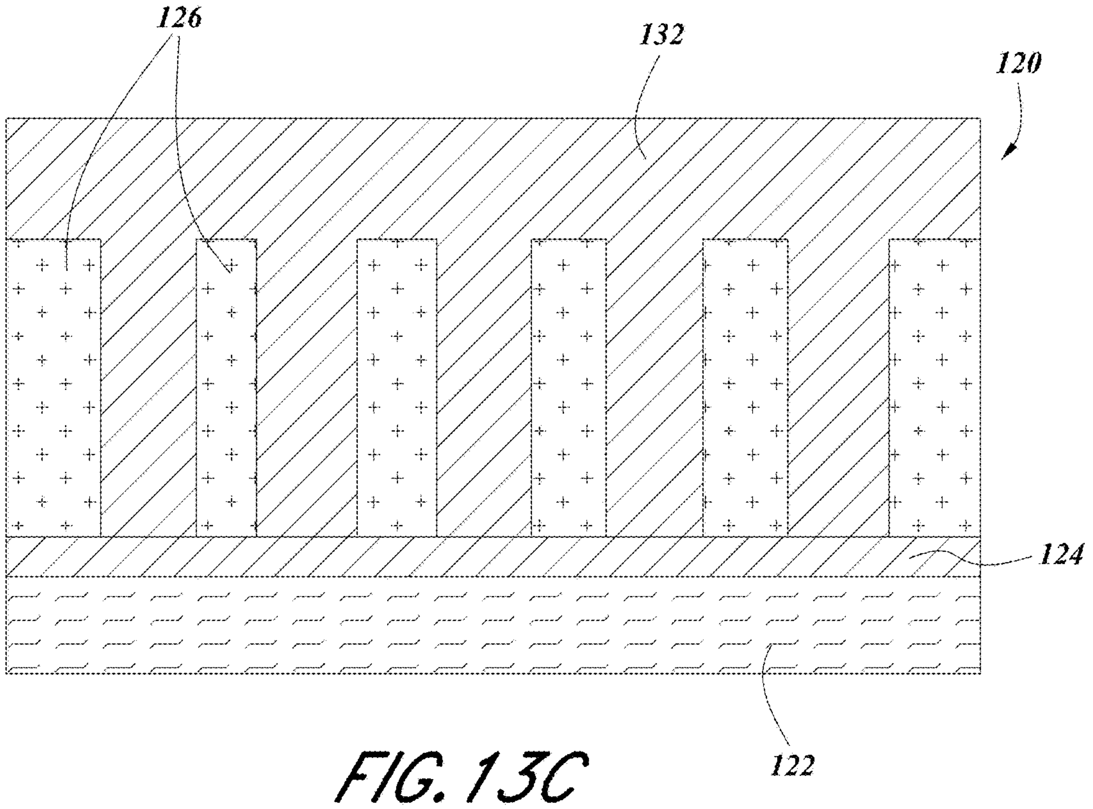

The first cavities 128 in FIG. 13B can be filled with a conductive material to form first electrodes 132 electrically connected with the conductive layer 124 of the element 120, as shown in FIG. 13C, a schematic cross-sectional view of the element 120. The conductive feature material filling step may comprise electrodeposition methods using suitable chemical baths, or by Atomic Layer Deposition (ALD), Chemical Vapor Deposition (CVD) or other suitable deposition methods. For some materials, such as some electrode materials that tend to diffuse through dielectrics, such as copper, the cavity filling step may comprise depositing a thin barrier layer (e.g., metal nitride) and/or adhesion layer over the walls of the dielectric layer. A seed layer may be coated over the barrier layer in some embodiments, e.g., prior to filling the cavities. In some embodiment, a high resistivity barrier may not be desirable, and instead a nitrogen bearing plasma may be applied to treat the surface of the cavities in the second dielectric layer prior to filling the cavities with the conductive material. A seed layer may be applied to the surfaces of the cavities before the cavity filling step.

Figure 13D:
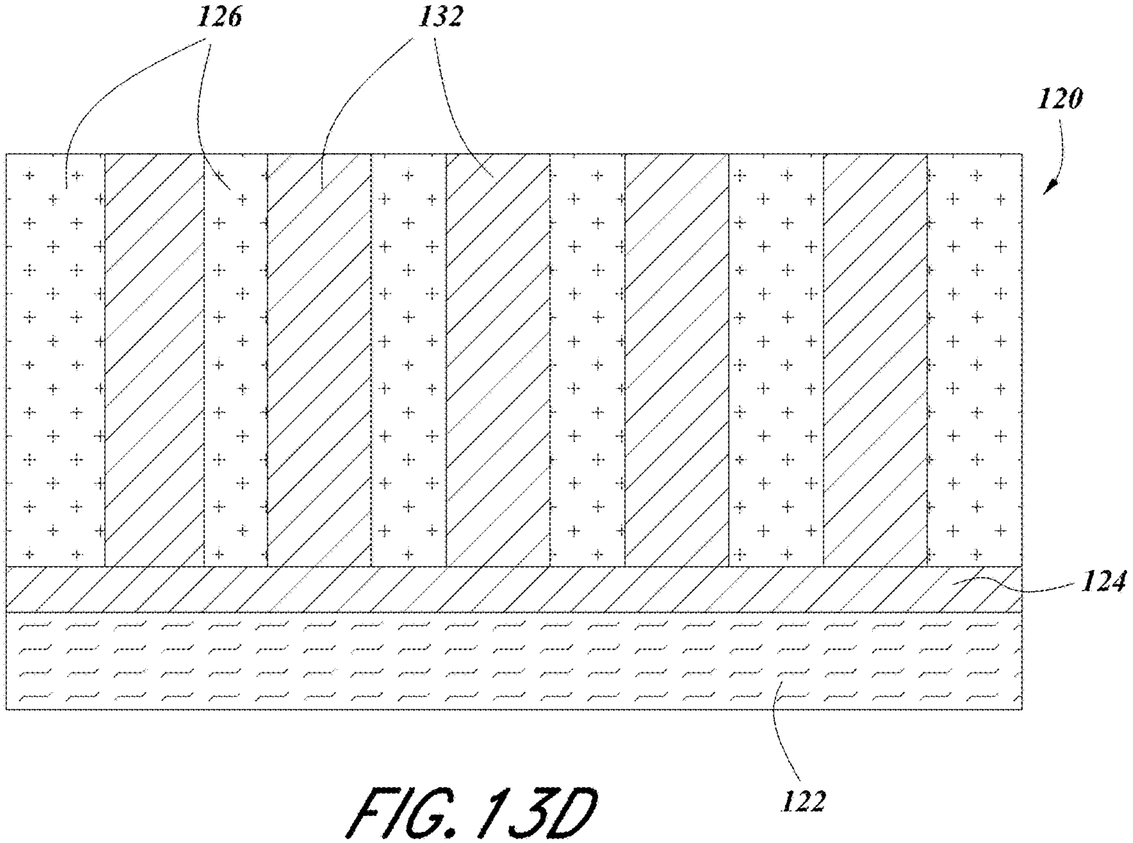
Figure 13E:
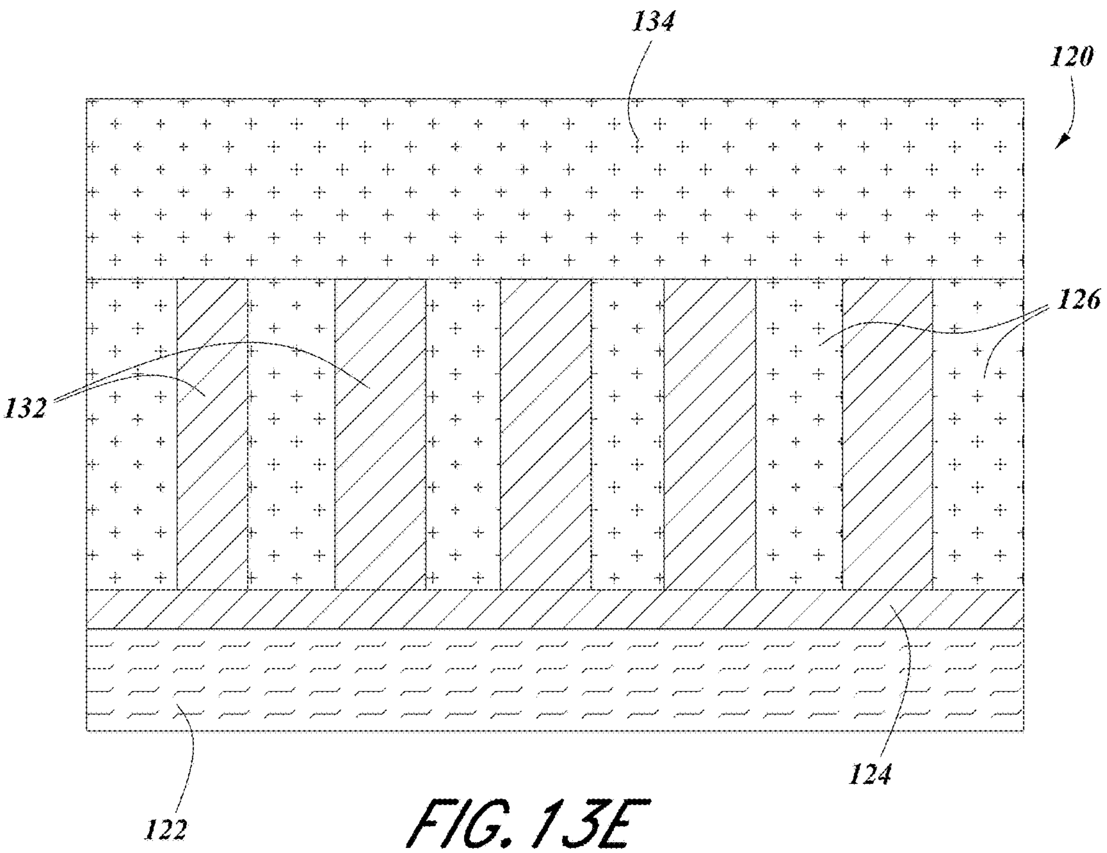

Proceeding to FIG. 13D, a planarization process is applied to remove conductive overburden, e.g., portions of the conductive feature extending over the insulating layer 126, so that the embedded first electrodes 132 are flush with the upper surface of the insulating layer 126. The planarization processes may include removing portions of any barrier layer between the conductor and the dielectric materials, and portions of the first dielectric layer. The first electrodes 132 and the conductive layer 124 may have the same material composition, so that they are electrically connected. Then in FIG. 13E, a second dielectric layer 134 can be coated over the embedded first electrodes 132 and the first dielectric layer 126. In some embodiments, the second dielectric layer 134 may have the same material as the first dielectric layer 126; in other embodiments, they may be different materials.

Figure 13F:
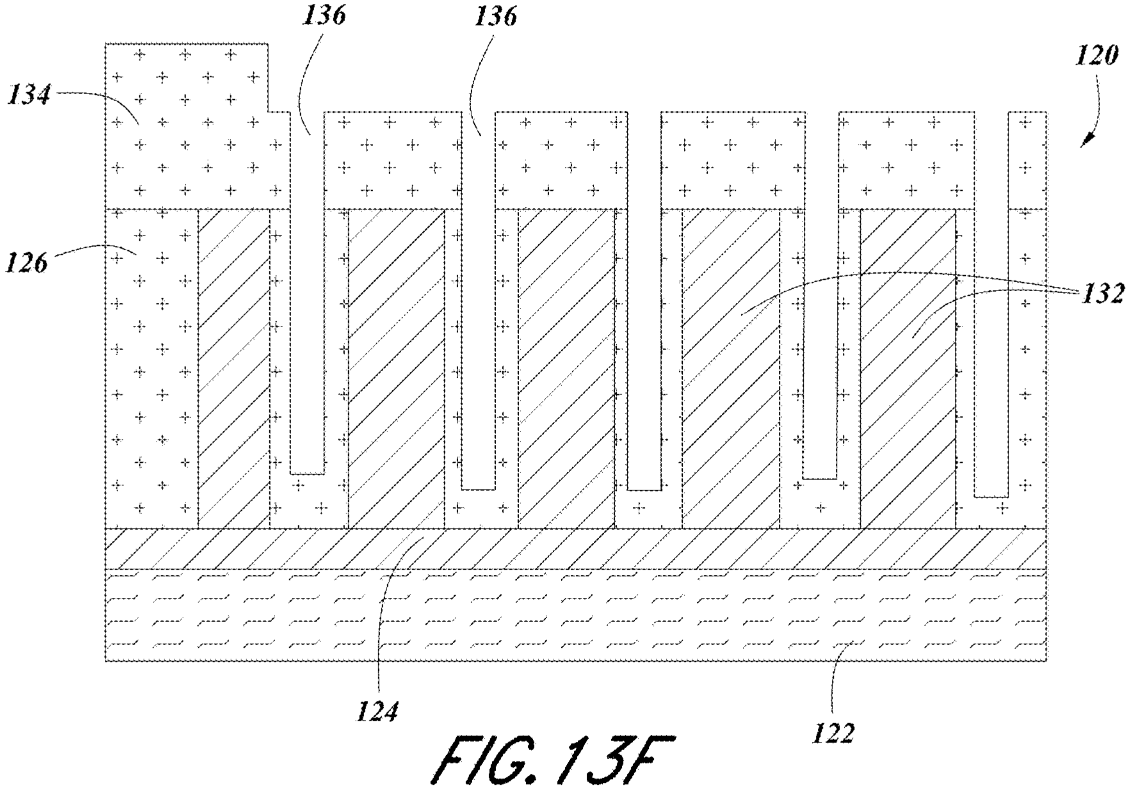
Figure 13G:
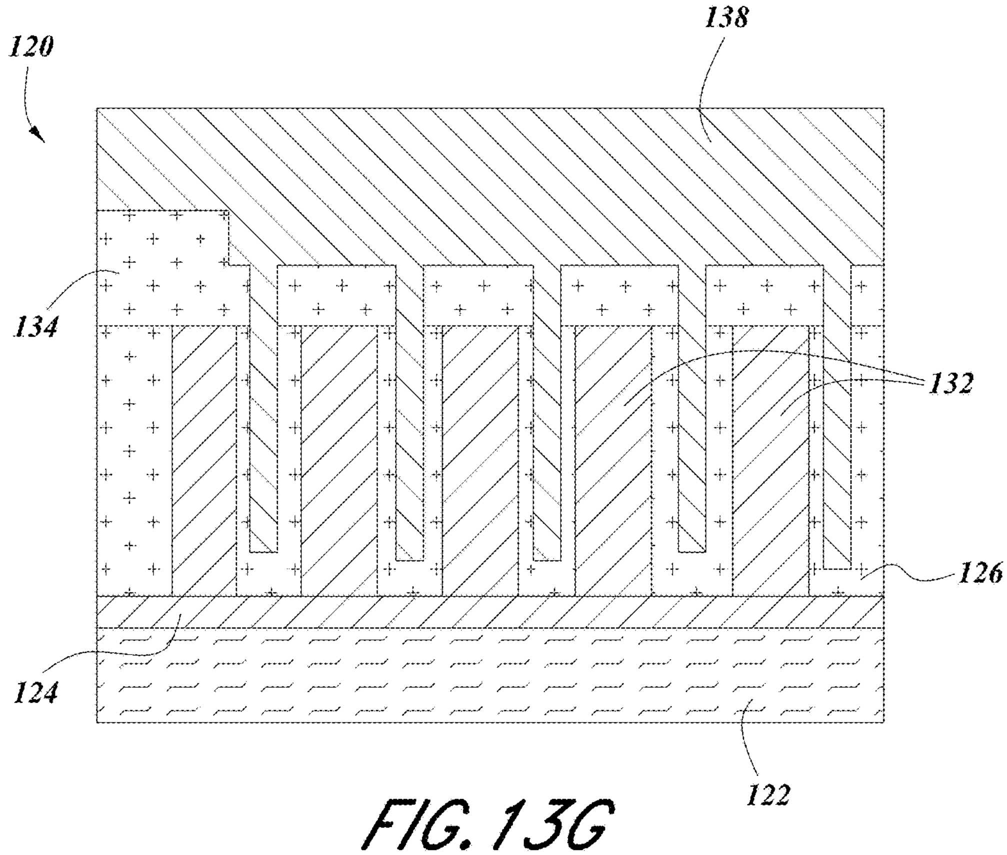
Figure 13H:
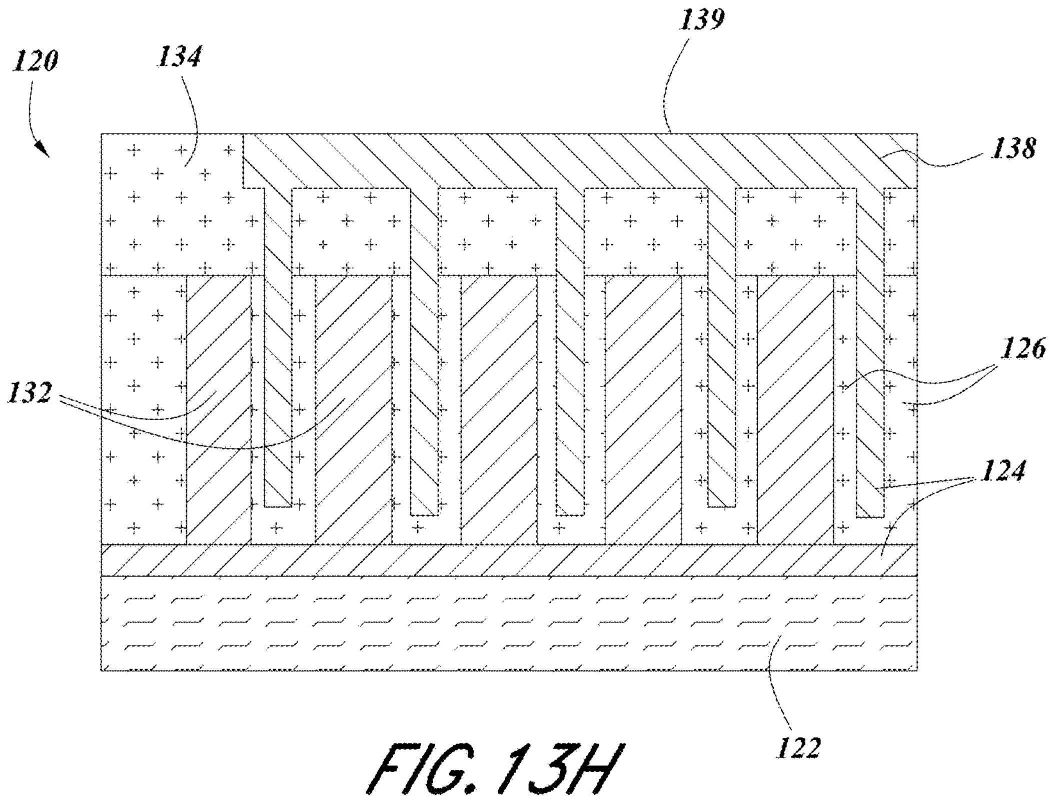
Figure 13I:
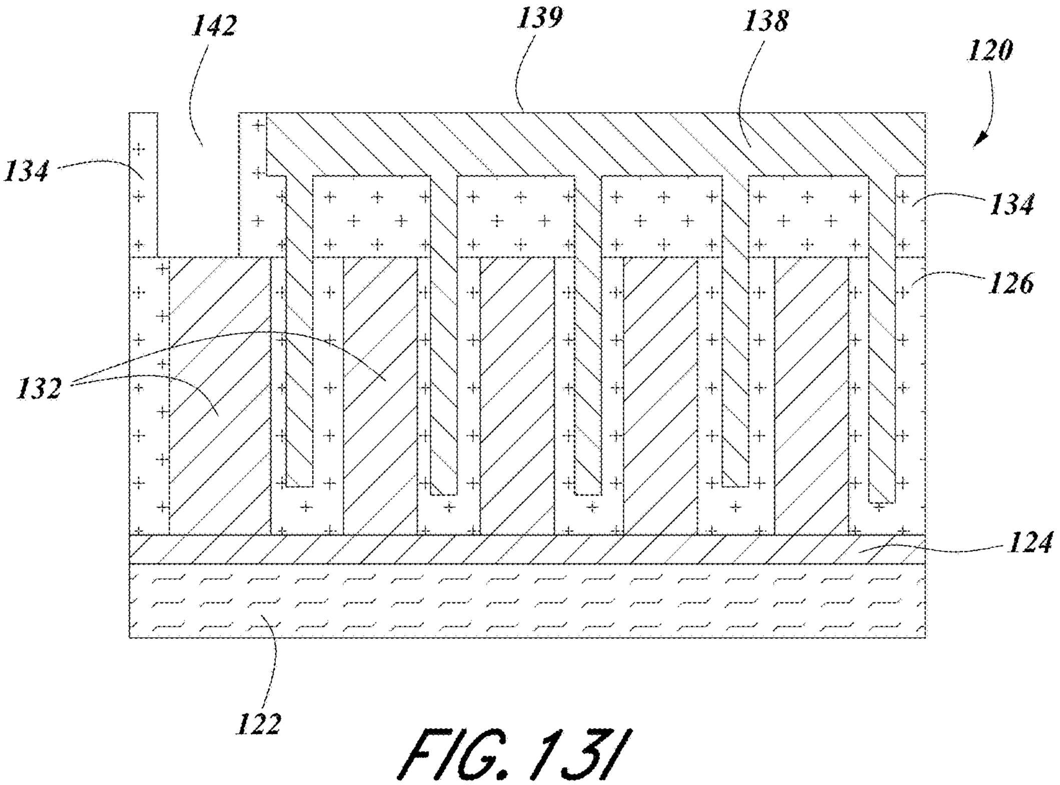
Figure 13J:
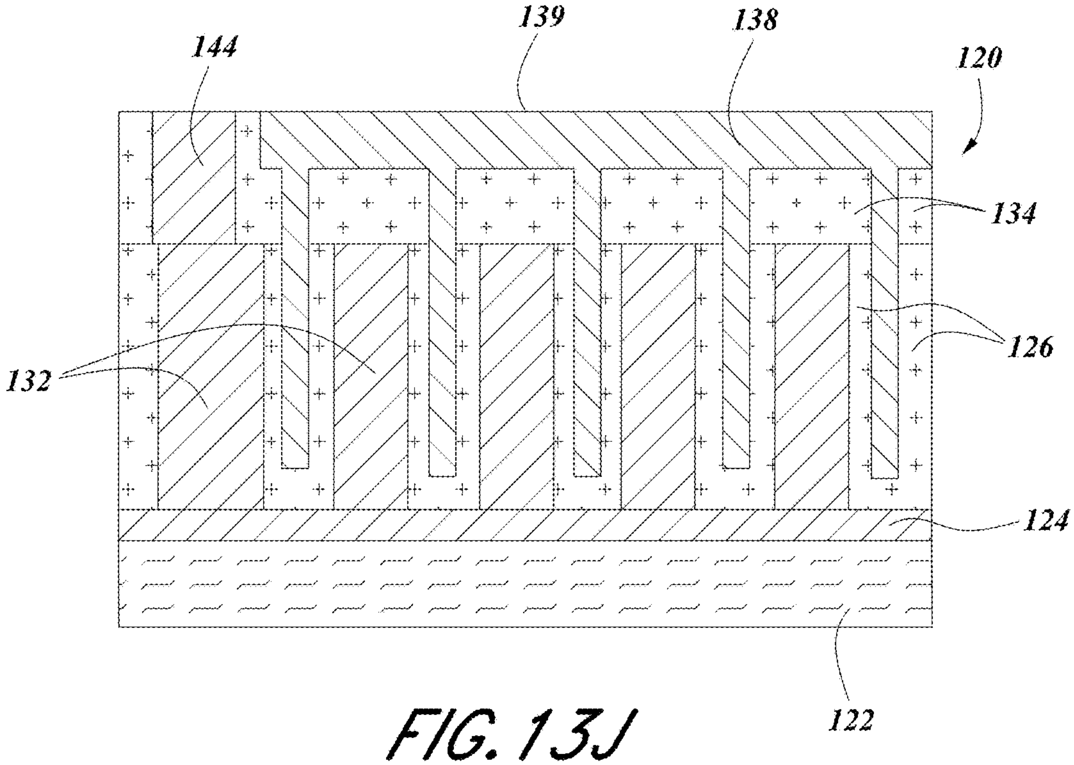

Referring to FIG. 13F, selectively patterning is applied, for example by the RIE method, to form cavities 136 through the second dielectric layer 134 and the first dielectric layer 126 and between the embedded first electrodes 132, for the second electrodes to be formed. The cavities 136 can be filled with a conductive feature material to form second, upper electrodes 138, as shown FIG. 13G, a schematic cross-sectional view of the element 120. FIG. 13H illustrates that portions of the conductive features 138 of the second electrodes are removed, e.g., by a planarization process, to form embedded second electrodes and a contact area 139 to the second electrodes in the element 120. In FIG. 13I, selectively patterning is applied to a portion of the second dielectric layer 134 to form a contact pad cavity 142 to reach the first electrodes 132. FIG. 13J illustrates that a planarized conductive contact pads 144 can be formed in the contact cavity 142. The contact pads 144 of the first electrodes 132 and the exposed top contact surface 139 of the second electrodes 138 can be prepared to be directed bonded to another semiconductor element.

Figure 13K:
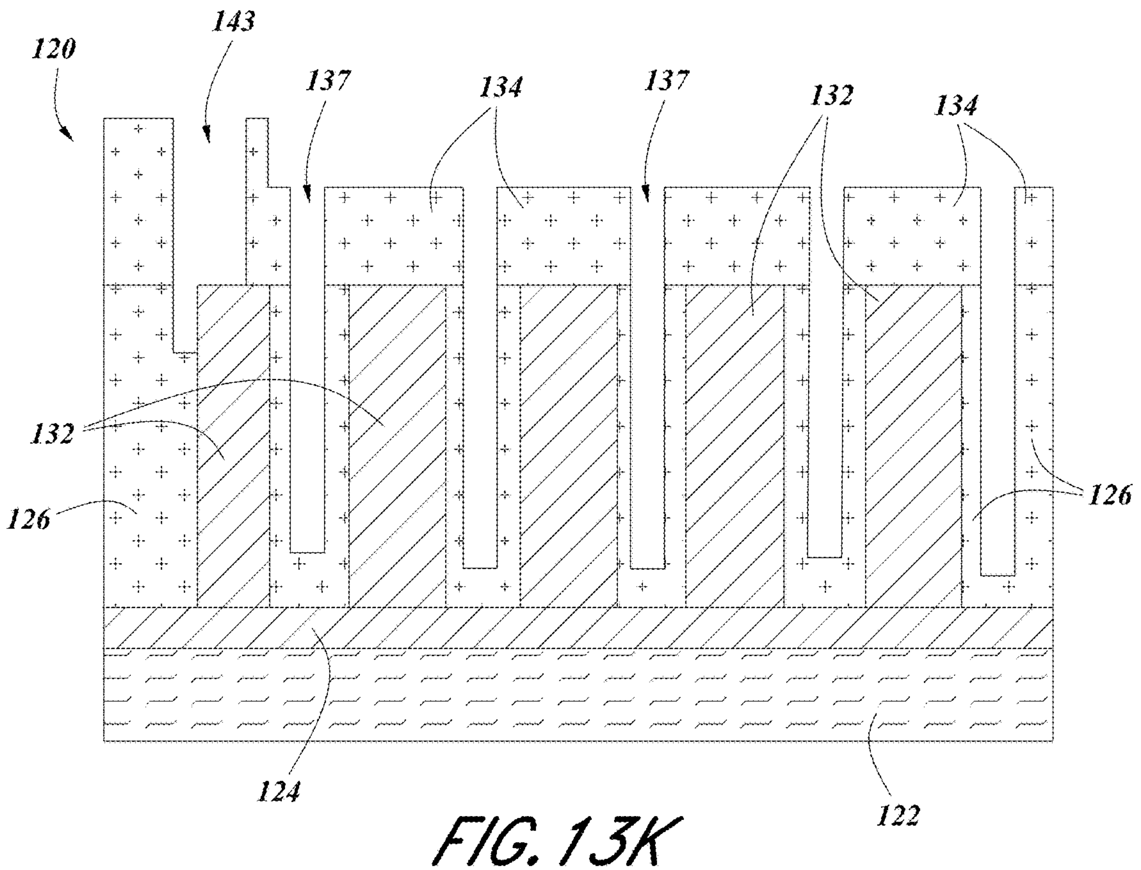
Figure 13L:
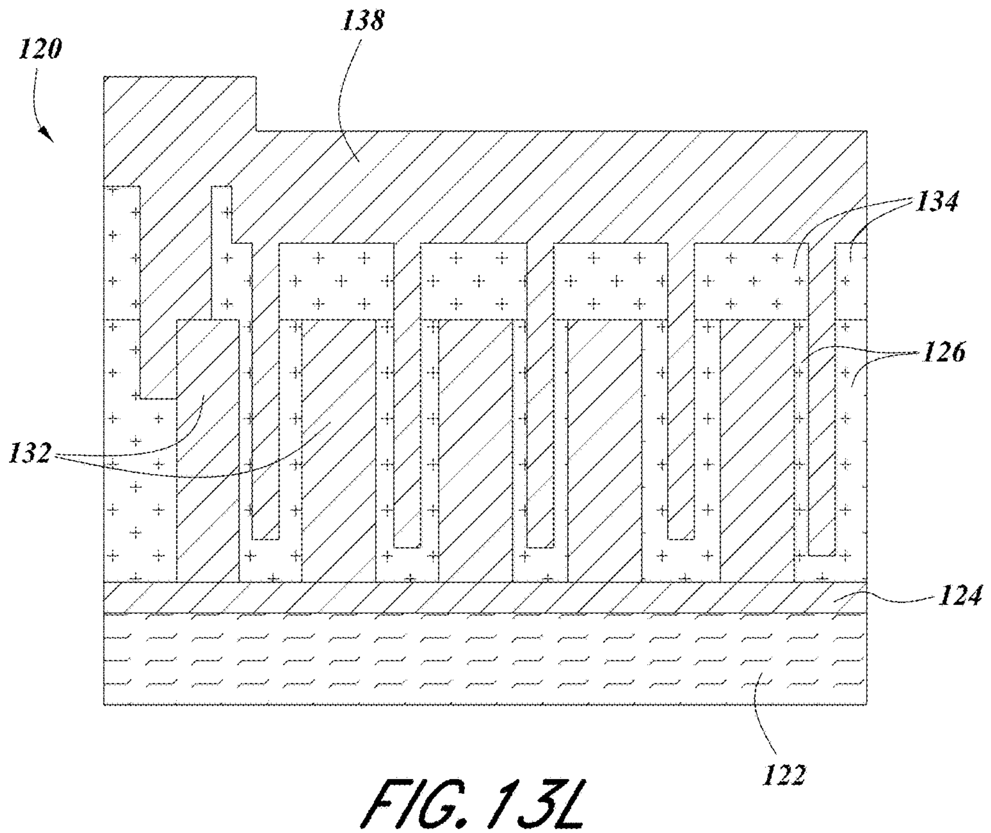
Figure 13M:
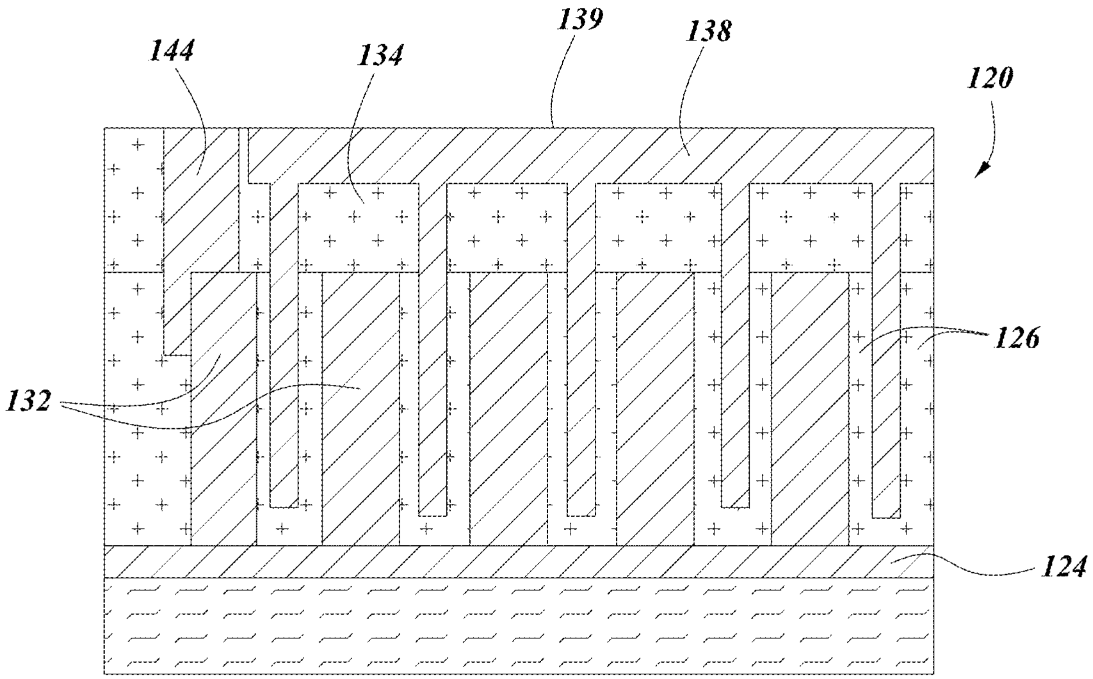
Figure 13N:
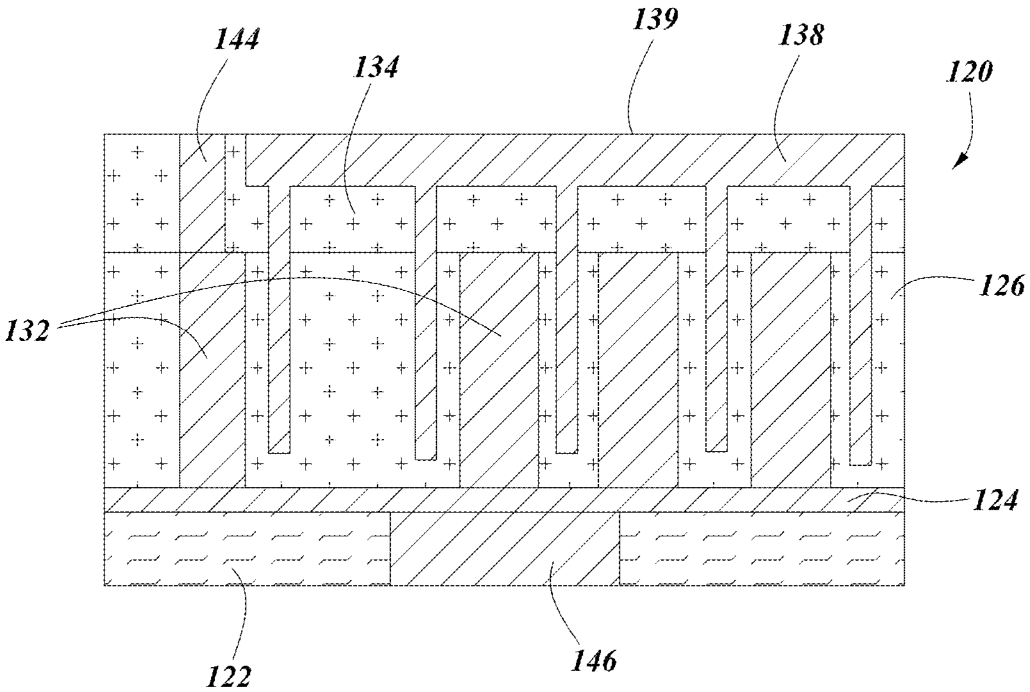

Alternatively, a lower cost method for fabricating a 3D capacitor may be used. After the same steps as described with respect to FIGS. 13A-13E, the lower cost method may include steps illustrated in FIG. 13K-13M. In FIG. 13K, a selectively patterning is applied to the second dielectric layer 134 and the first dielectric layer 126 between the embedded first electrodes 132, for example by the RIE methods described hereabove, to form second cavities 137 in the dielectric layers 134 and 126 for the second electrodes and simultaneously form a via cavity 143 for a contact pad feature connected to the first electrodes 132. In FIG. 13L, a conductive material is deposited in the second cavities 137 to form the second electrodes 138 and in the via cavity 143 to form the contact pads for the first electrode 132. As shown in FIG. 13M, excess portions of the conductive material 138 can be removed by a planarization process, e.g., a chemical mechanical polishing, or CMP, process, to form the contact features 139 to the second electrodes 138 and the contact pad features 144 for the first electrodes 132 in the element 120. In some embodiments, the element may comprise a passive component having a top or a bottom contact, or both, connected to the first and/or the second electrodes of the 3D capacitor. Such an example embodiment is illustrated FIG. 13N, a schematic cross-sectional view of the element 120 showing the top contact pads 144 and bottom contacts 146 connecting to the first electrodes 132 of the element 120. The second electrodes 138 of the 3D capacitor in FIG. 13N have the top contact surfaces 139, and may have bottom contact pads that are not visible in the view.

Figure 14A:
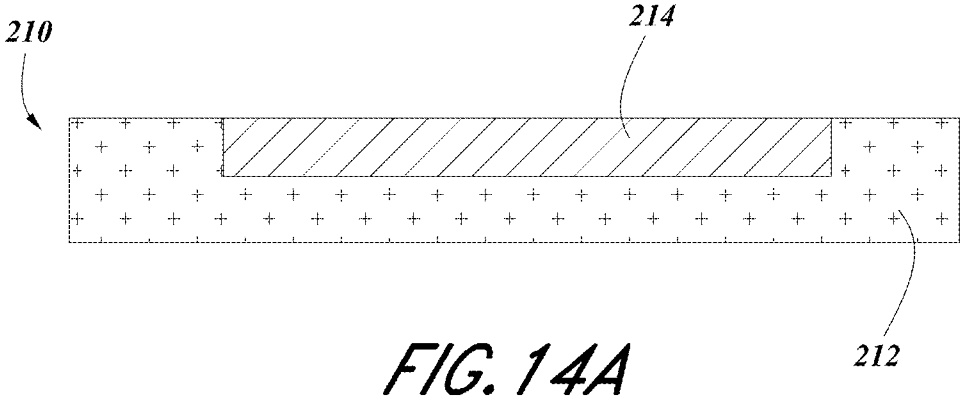
FIGS. 14A-14N are schematic cross-sectional views illustrating an alternative example embodiment process to produce the 3D capacitor structures shown in FIG. 12A.
Figure 14B:
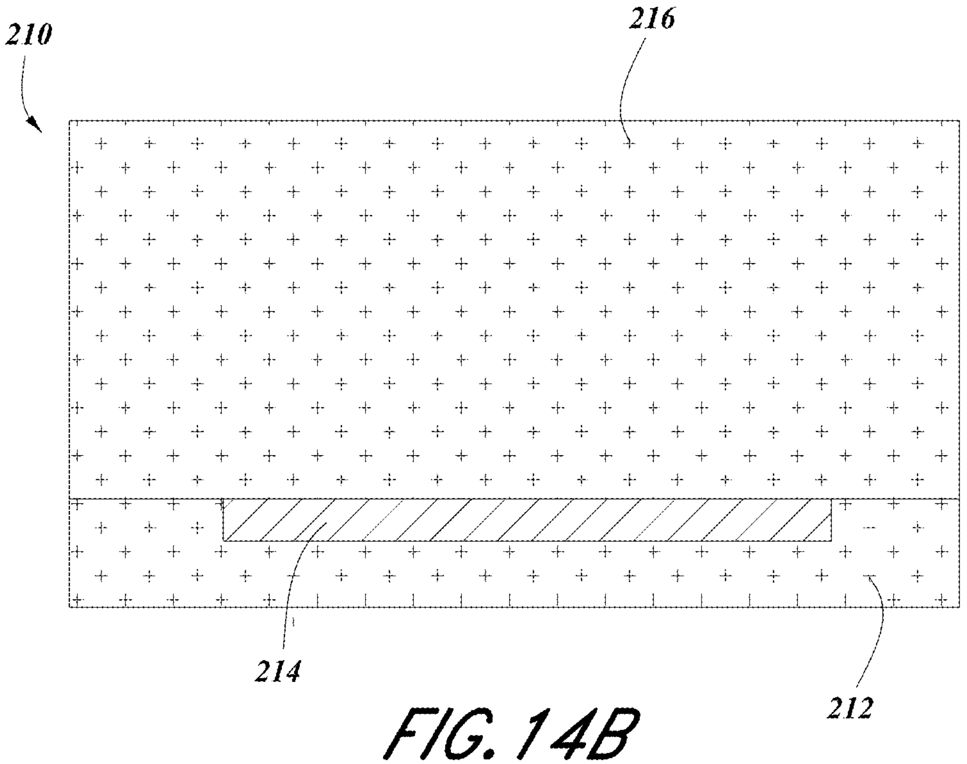

In some embodiments, more than one type of dielectric materials may be applied in forming the electrical or non-electrical components of interest. For example, a second dielectric material having a different composition or different dielectric or optical properties, e.g., dielectric constant, hardness, material composition, etc., may be embedded in a cavity formed in the first dielectric layer. As an example, the first dielectric layer may comprise silicon oxide and the second dielectric layer may have a dielectric constant k higher than that of silicon oxide. Such a second dielectric layer may comprise silicon nitride, titanium dioxide, tantalum oxide, barium titanate, zirconium oxide, dielectrics bearing hafnium oxide, etc. Passive components may be formed in patterned cavities of the second dielectric layer. FIG. 14A to FIG. 14N illustrate such structures and example methods for forming a 3D capacitor in an element comprising more than one dielectric layers.

Referring to FIG. 14A, a schematic cross-sectional view of an element 210 at a stage of fabrication is illustrated. In FIG. 14A, a first conductive layer 214 can be formed in a base dielectric layer 212. RIE (reactive-ion etching) methods may be applied to form a cavity with predetermined dimensions in the base dielectric layer 212, and a desirable conductive material or materials may be deposited in the cavity of the base dielectric layer 212 to form the first conductive layer 214. CMP (chemical mechanical polishing) methods may be applied to planarize the coated conductive materials to form a planar surface comprising a portion of the base dielectric layer 212 and the upper surface of the conductive layer 214. The first conductive layer 214 may form a portion of a first electrodes. In FIG. 14B a first dielectric material 216 is deposited on top of the base dielectric layer 212 and the top surface of the first conductive layer 214. After the first dielectric layer 216 is formed, it cooperates with the base dielectric layer 212 to embed the first conductive layer 214 therein. The additional portion of the first dielectric layer or material 216 may be coated over the upper surface of the first conductive layer 214 to fully embed the layer. The CMP methods may be applied to planarize the upper surface of the first dielectric layer 216 to a predetermined thickness.

Figure 14C:
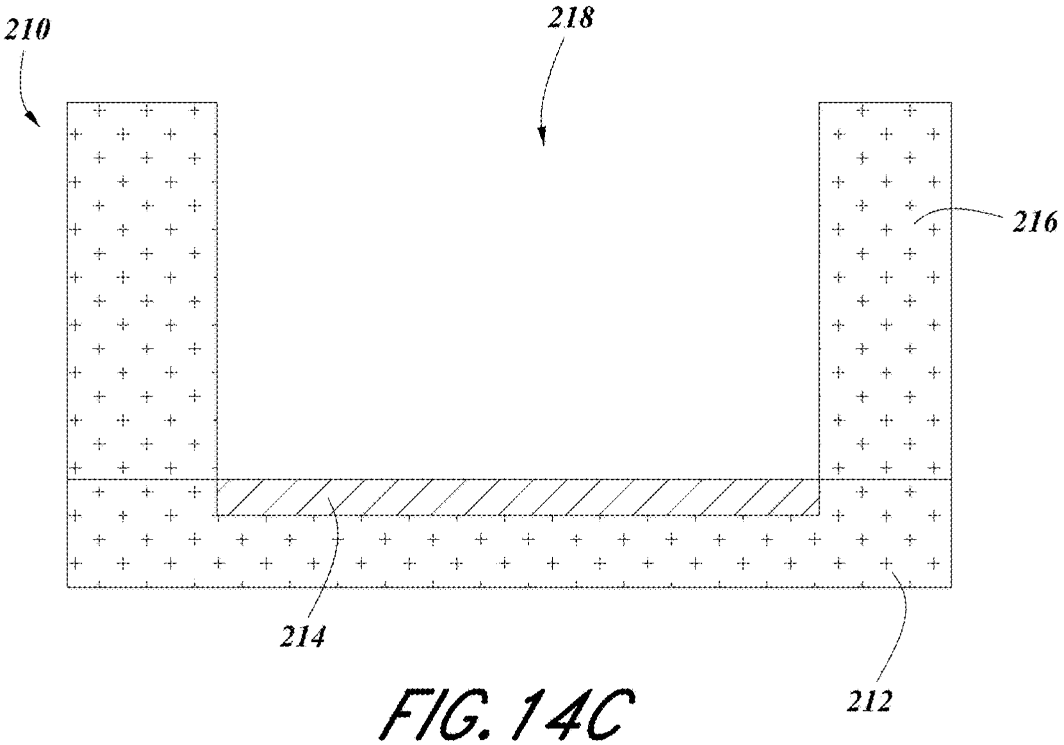
Figure 14D:
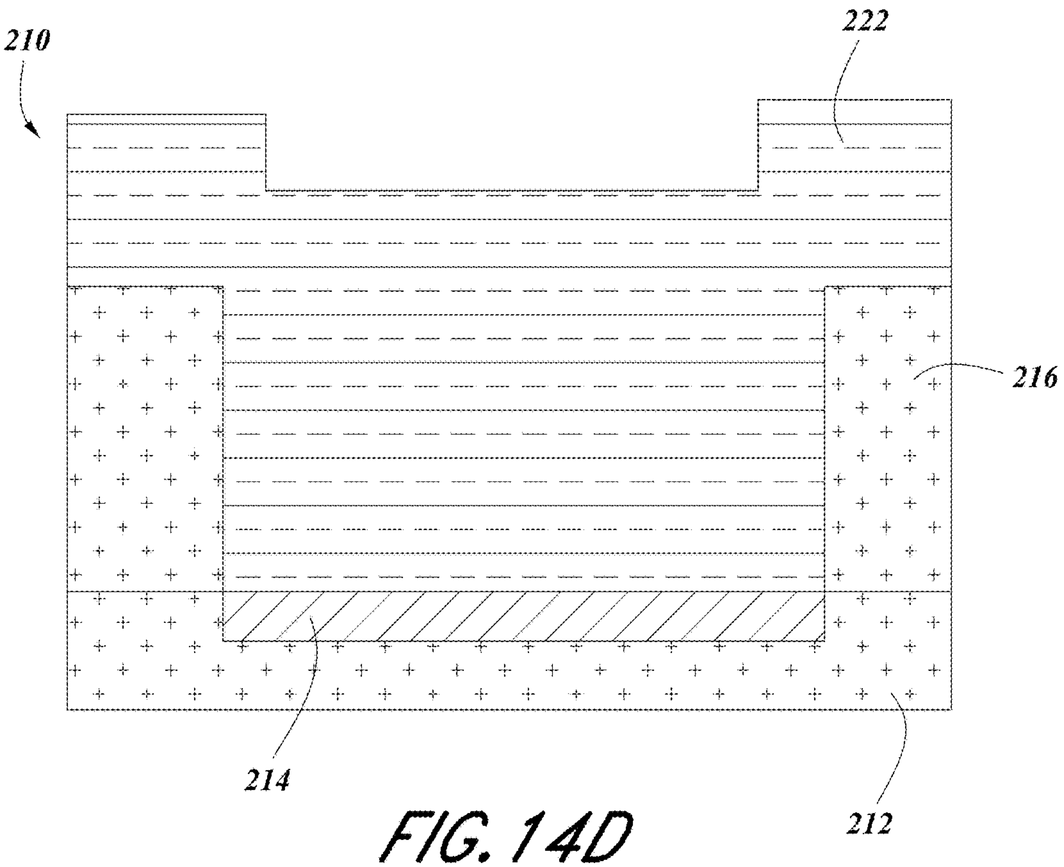

In FIG. 14C, the first dielectric layer 216 is selectively patterned to form a cavity 218 to expose the first conductive layer 214, for example, by RIE methods. In FIG. 14D the cavity 218 is filled with a second dielectric material 222. The second dielectric layer 222 may have a different composition or different dielectric or optical properties, for example, dielectric constant, hardness, material composition, etc., from those of the first dielectric layer 216. The steps of forming the embedded second dielectric layer 222 in the cavity 218 of the first dielectric layer 216 in FIG. 14C may comprise multiple intermediate coatings and polishings of the coated dielectric layers, depending upon the depth and width of the cavity 218. For example, for a 3-micron deep cavity 218 in the first dielectric layer 216, one micron of the second dielectric material may be deposited inside the cavity and on the top surface of the first dielectric layer 216 at a time to form the second dielectric layer 222. The CMP methods or other methods may be applied to remove the unwanted second dielectric portions on the element 210. The process may be repeated enough times to substantially fill or overfill the cavity 218.

Figure 14E:
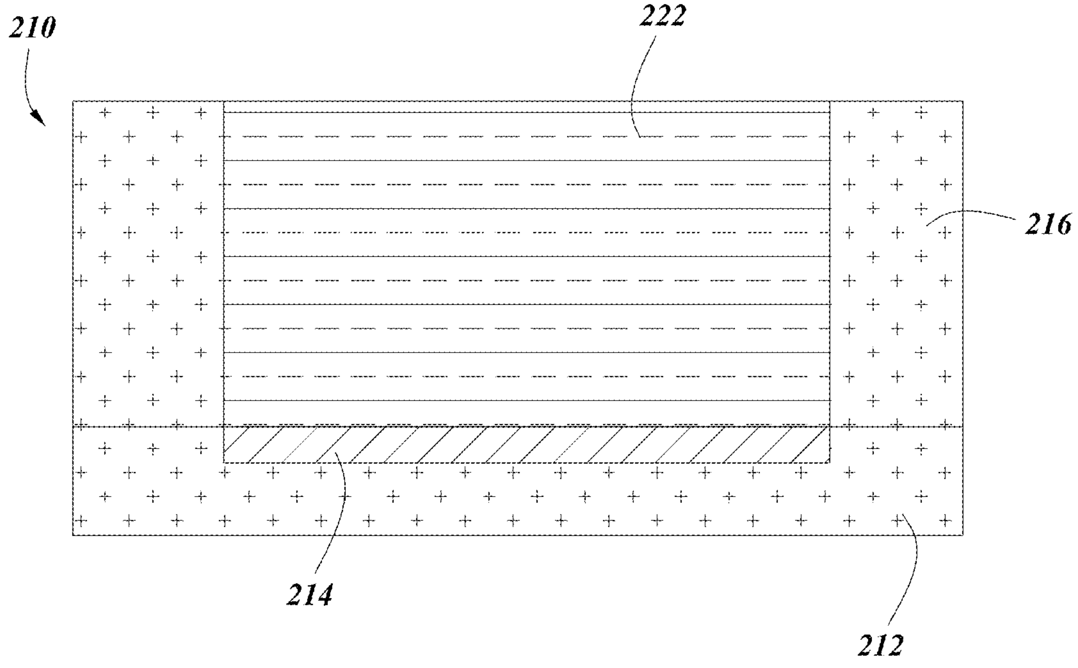

Proceeding to the step illustrated in FIG. 14E, the second dielectric layer 222 is planarized so that the second dielectric layer 222 is embedded on top of the first conductive layer 214 and surrounded by the first dielectric layer 216. For example, the unwanted portions of the coated second dielectric layer 222 may be planarized to form a planar surface comprising portions of the first dielectric layer 216 and portions of the second dielectric layer 222. The planarization process may further include removing portions of the top surface of the first dielectric material 216.

Figure 14F:
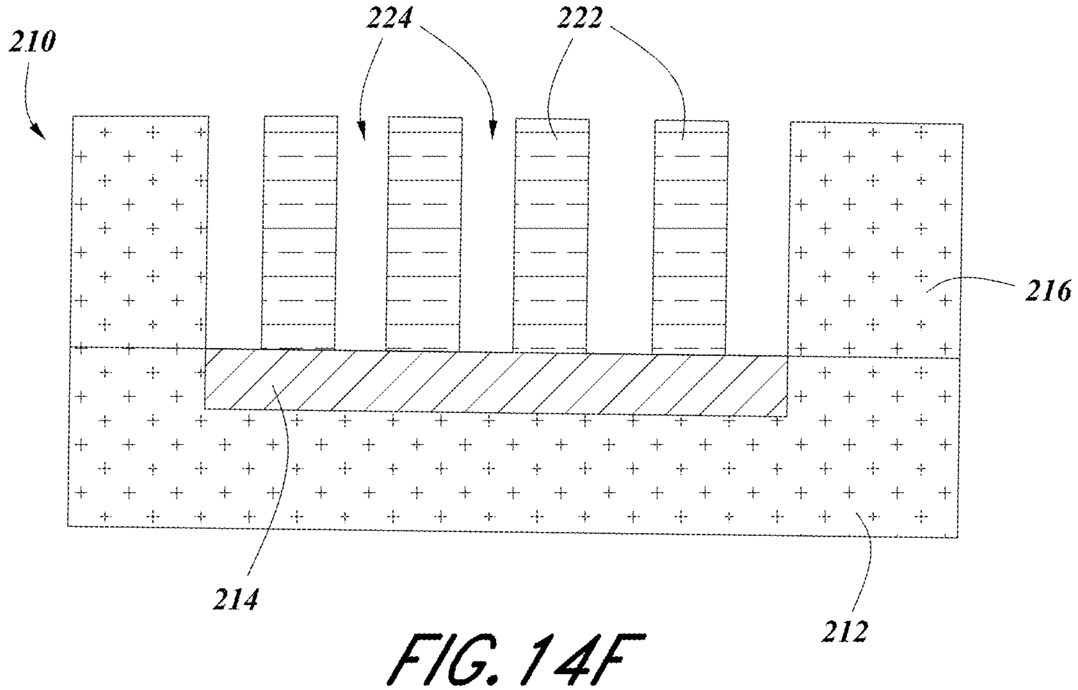
Figure 14G:
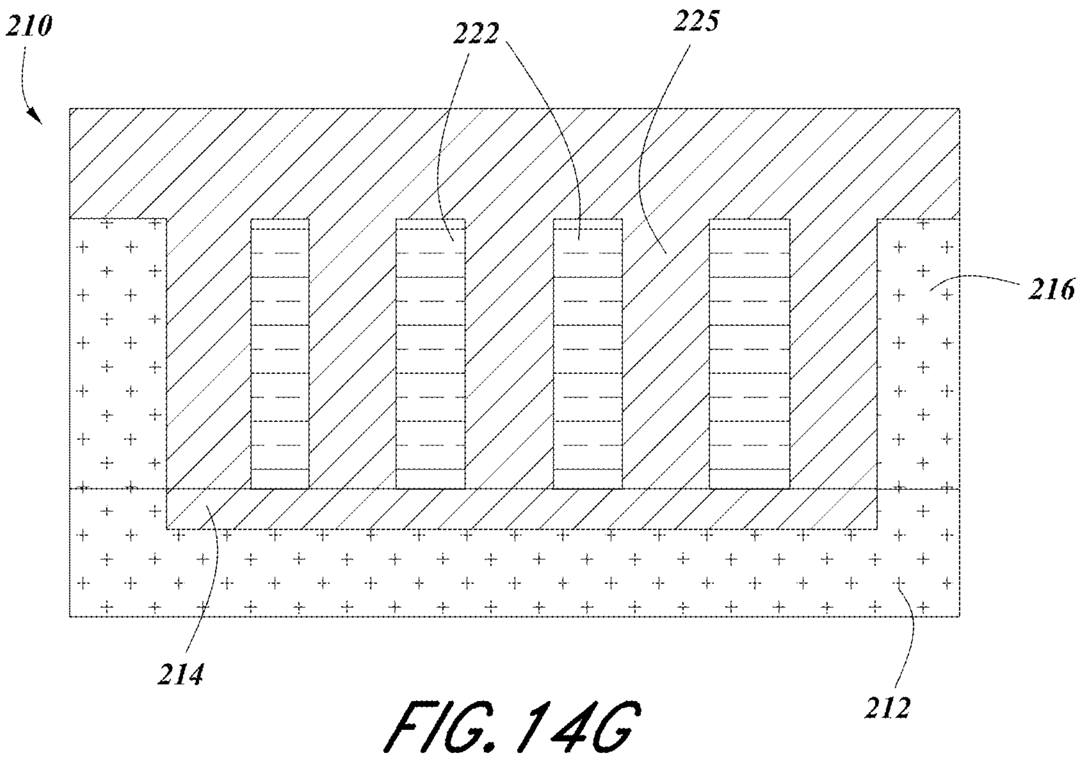

Referring now to FIG. 14F, the second dielectric layer 222 is selectively patterned to form cavities 224 for first electrode members, for example, by the RIE methods. The formed cavities 224 may expose the top surface of the embedded first conductive layer 214. In FIG. 14G, the cavities 224 are filled with a conductive material to form first electrode members 225 connecting the embedded first conductive layer 214 of the element 210. For example, the conductive material may fill or overfill the cavities 224 formed in the second dielectric layer 222 to form the first electrode members 225. After this step the conductive first electrode members 225 connects with the first conductive layer 214 to form the first electrodes of the 3D capacitor.

Figure 14H:
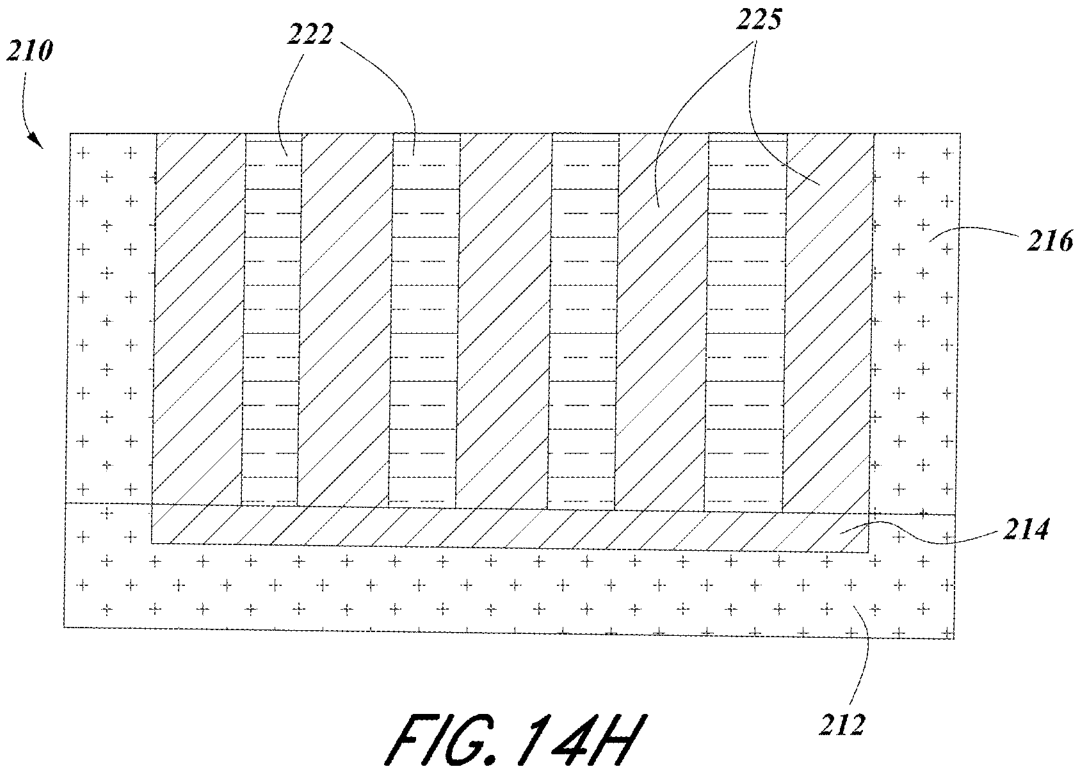
Figure 14I:
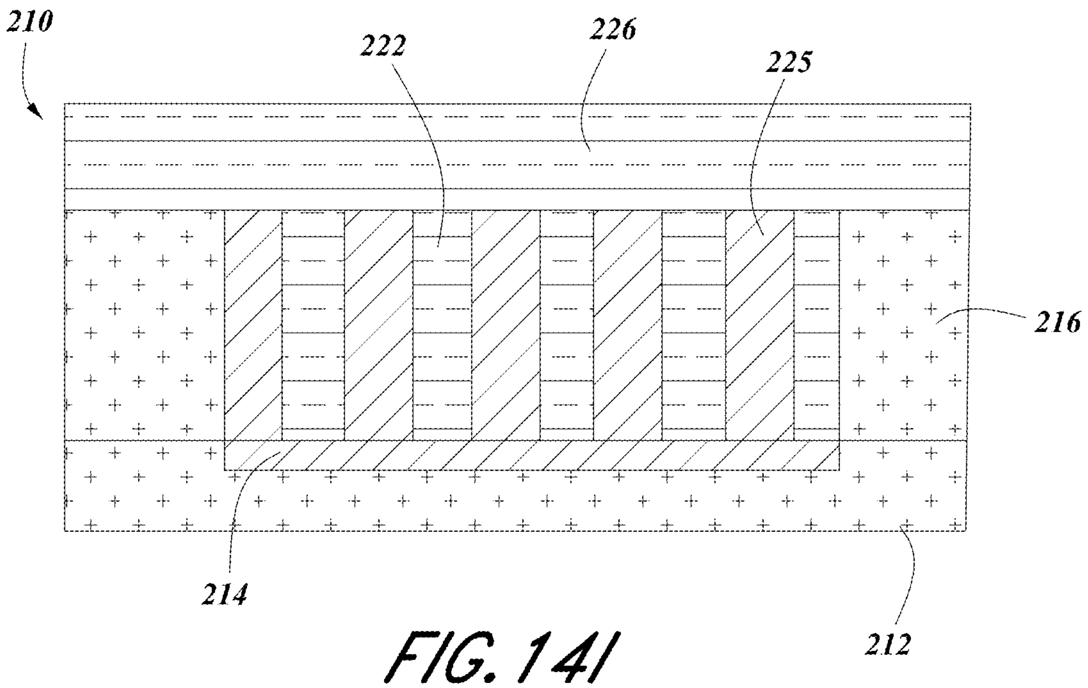
Figure 14J:
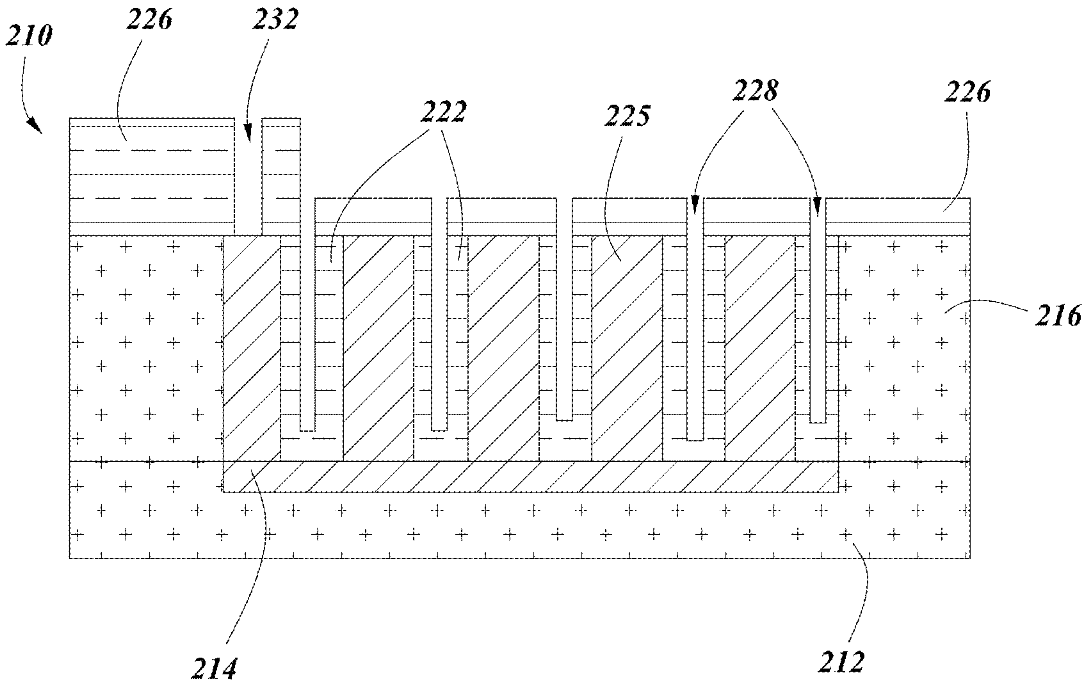

Turning to FIG. 14H, excess portions of the conductive materials connected to the first electrodes 225 in FIG. 14G can be removed, for example by planarization processes. The planarization processes may include removing portions of any barrier layer between the conductor and the dielectric materials, and portions of the first and second dielectric layers. In FIG. 14I, an third dielectric layer 226 of a suitable thickness may be coated over the planarized surface to embed the first electrode members 225. This third dielectric material 226 may have the same material and properties as second dielectric layer 222. Similar to the methods and structures described in connection with FIG. 13F, FIG. 14J illustrates the step of selectively patterning the third and second dielectric layers 226 and 222 and forming second cavities 228 between the embedded the first conductive electrode members 225 for second electrode members to be deposited, as well as forming contact cavities 232 for contact pads of the first conductive electrodes 225.

Figure 14K:
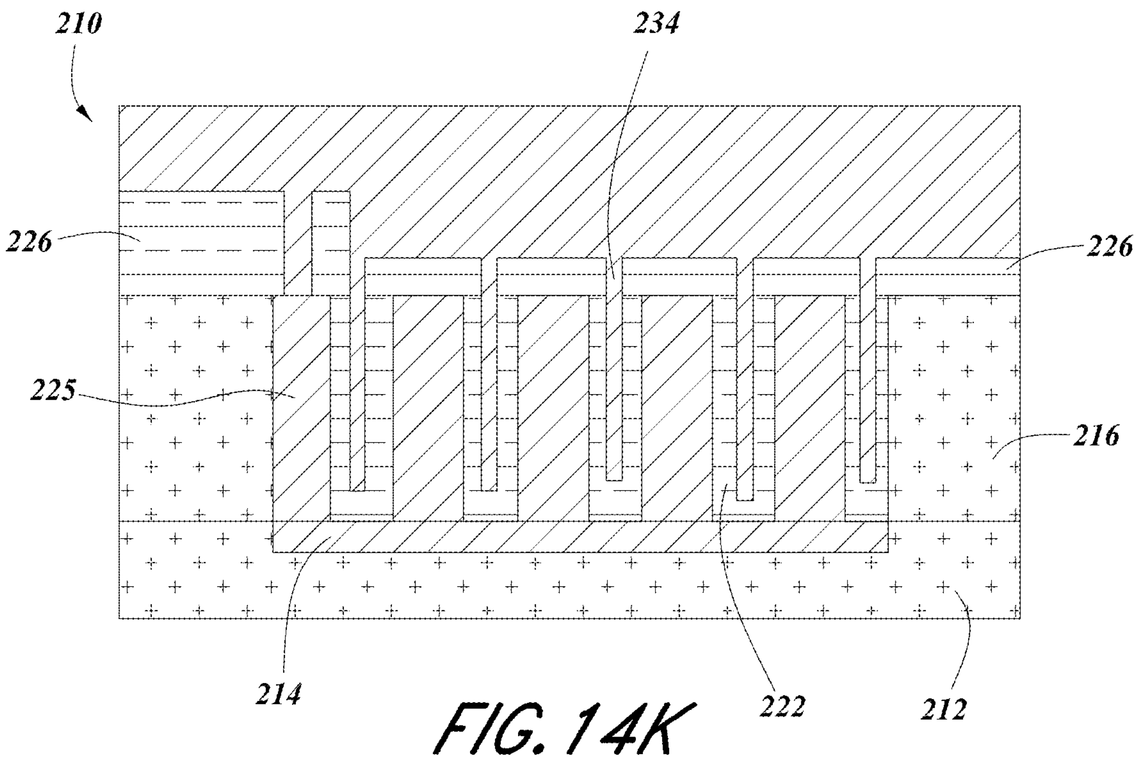
Figure 14L:
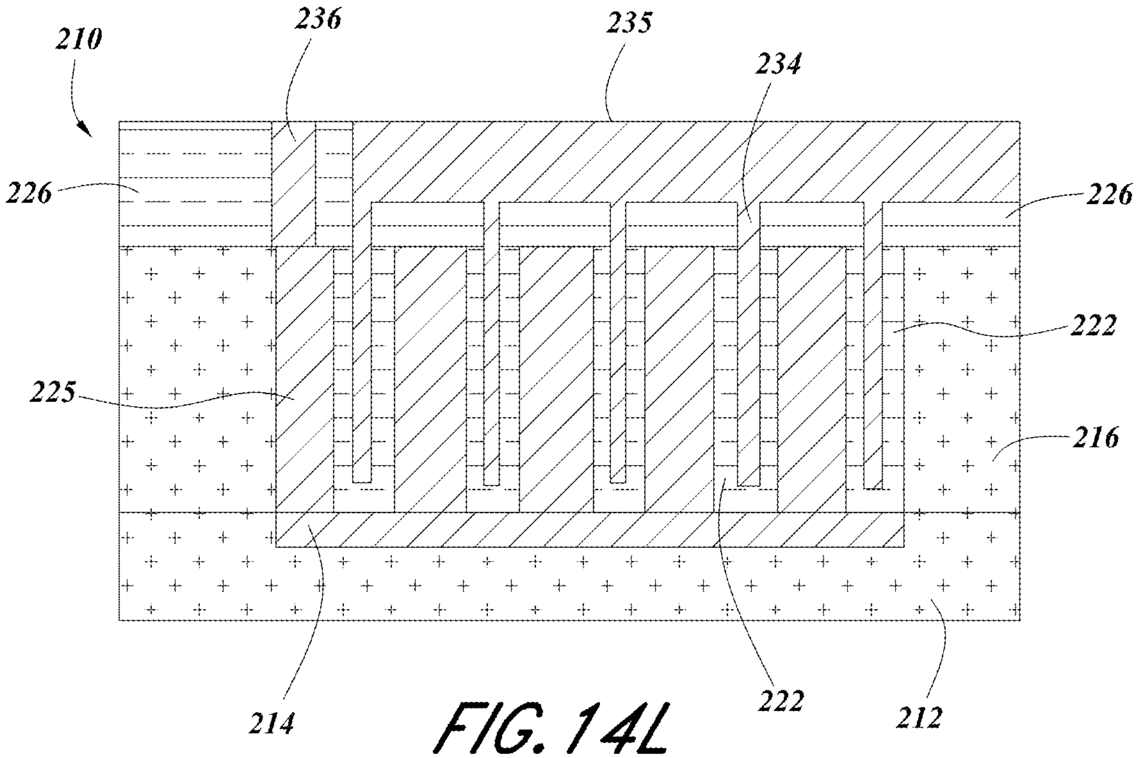
Figure 14M:
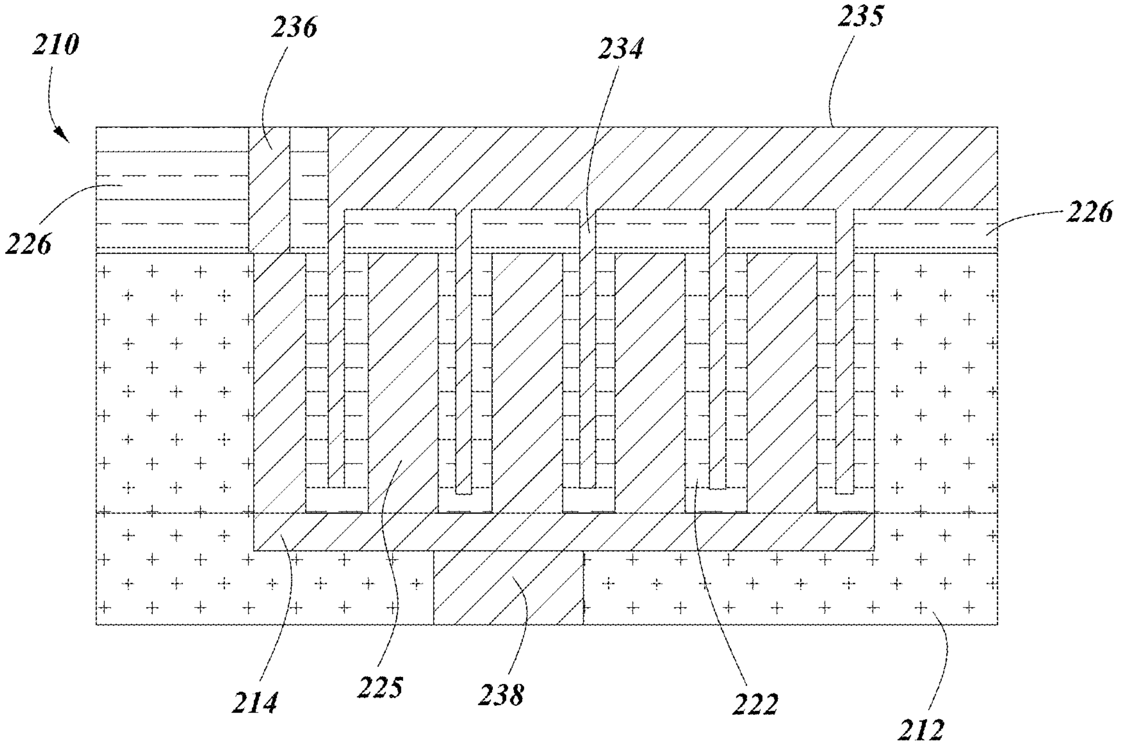
Figure 14N:
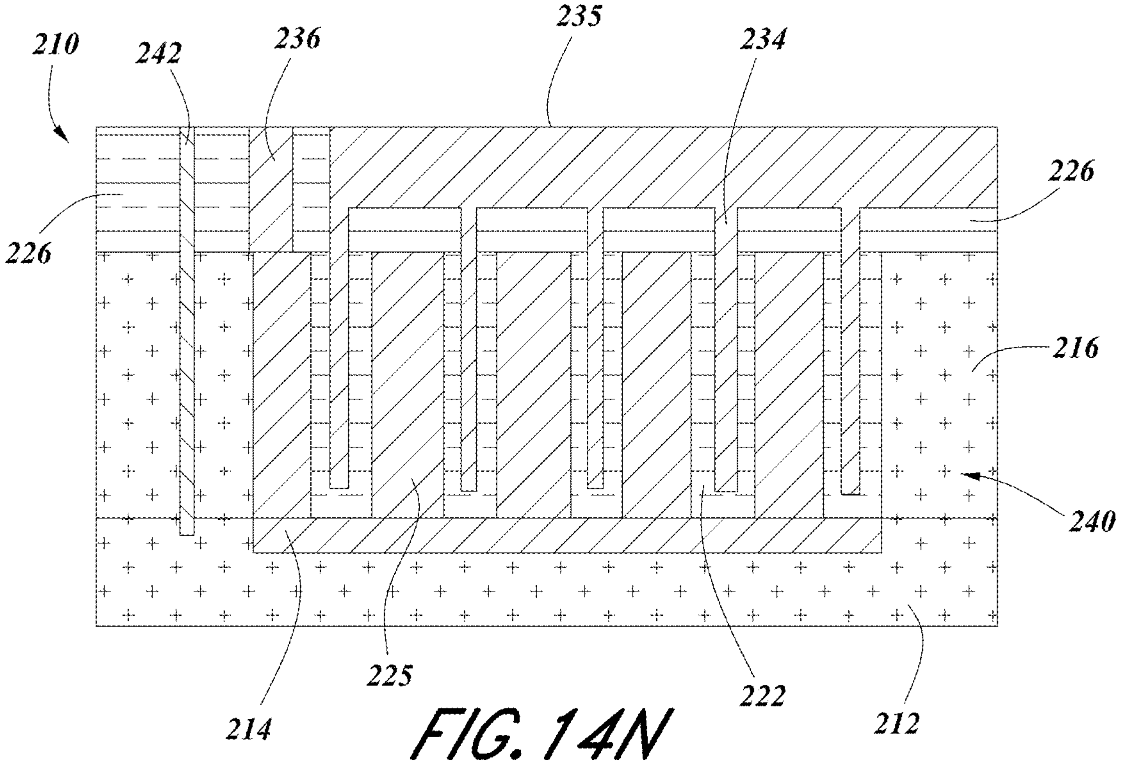

Referring to FIG. 14K, a conductive material fills in the second cavities 228 to form second electrode members 234 and contact pads for the first electrodes 225. For example, conductive features for the second electrodes may be formed by filling the cavities 228 in the dielectric layers 226 and 222 between the first electrode members 225. And contact pads for the first electrodes 225 may be formed in the cavities 232 connected to first electrodes 225. Similar to the method described in connection with FIG. 13J, FIG. 14L illustrates the step of removing excess conductive materials to form a smooth surface of the second electrodes 234, for example, by CMP methods. The smooth upper surface of the second electrode 234 serves as contact contacts 235 to be bonded to another semiconductor element, together with the contact pads 236 formed after planarization. The CMP processes may include removing the barrier layer and portion of the top surface of the first and second dielectric layers. FIG. 14M shows that contacts 238 are formed at the bottom of the element 210 connecting to the conductive layer 214 which is part of the first electrode including first electrode member 225. The element 210 has top electrical contacts 236 connecting to the first electrode members 225 and contact surfaces 235 connecting to the second electrodes 234 in addition to the bottom contacts 238 to connect to the conductive layer 214 of the first electrode. The element 210 may have contacts at the bottom (not shown) to connect to the second electrodes 234.

Referring to FIG. 14N, a 3D capacitor 240 in the element 210 comprises the first electrodes 225 and the second electrodes 234 embedded in the dielectric layers 212, 216, 222 and 226. Respectively, the first electrodes 225 and the second electrodes 234 have conductive contacts 236 and 235 at the top surface prepared to be hybrid-bonded with another element. An isolation feature 242 extends through the third and second dielectric layers 226 and 222 and into the first dielectric layer 216 to reduce or minimize parasitic capacitance that may exist between the 3D capacitor 240 and other passive or conductive features in the element 210. The isolation feature or spacer 242 may be similar to those described previously, especially in FIGS. 2, 5, 9 and 12. The isolation spacers 242 may permit closer spacing of electrical components with reduced or minimal crosstalk or parasitic capacitance. The structures in FIG. 14N can be prepared for direct hybrid bonding with another element also having exposed conductive contacts.

While FIGS. 14A-14N illustrate methods for forming a parallel plate 3D passive element with an isolation spacer, it is to be understood that similar methods may be applied to fabricating rod-shaped 3D capacitors or other non-parallel plate 3D capacitors, or 2D passive elements, for example a 2D capacitor, with an isolation spacer. The 2D capacitor may be oriented parallel or perpendicular to the bonding surface of the element. In some example embodiments, the 2D capacitor may have a capacitor dielectric between electrodes that has a different composition, or different dielectric or optical properties from those of the surrounding material. For example, the capacitor dielectric of the 2D capacitor may have a higher dielectric constant than that of the surrounding material.

Electronic Elements

A die can refer to any suitable type of integrated device die. For example, integrated device dies can comprise an electronic component such as an integrated circuit (such as a processor die, a controller die, or a memory die), a microelectromechanical systems (MEMS) die, an optical device, or any other suitable type of device die. In some embodiments, the electronic component can comprise a passive device such as a capacitor, inductor, or other surface-mounted device. Circuitry, such as active components like transistors, can be patterned at or near active surface(s) of the die in various embodiments. The active surface may be on a side of the die which is opposite the backside of the die. The backside may or may not include any active circuitry or passive devices.

An integrated device die can comprise a bonding surface and a back surface opposite the bonding surface. The bonding surface can have a plurality of conductive bond pads including a conductive bond pad, and a non-conductive material proximate to the conductive bond pad. In some embodiments, the conductive bond pads of the integrated device die can be directly bonded to the corresponding conductive pads of the substrate or wafer without an intervening adhesive, and the non-conductive material of the integrated device die can be directly bonded to a portion of the corresponding non-conductive material of the substrate or wafer without an intervening adhesive. Directly bonding without an adhesive is described throughout U.S. Pat. Nos. 7,126,212; 8,153,505; 7,622,324; 7,602,070; 8,163,373; 8,389,378; 7,485,968; 8,735,219; 9,385,024; 9,391,143; 9,431,368; 9,953,941; 9,716,033; 9,852,988; 10,032,068; 10,204,893; 10,434,749; and 10,446,532, the contents of each of which are hereby incorporated by reference herein in their entirety and for all purposes.

Examples of Direct Bonding Methods and Directly Bonded Structures

Various embodiments disclosed herein relate to directly bonded structures in which two elements can be directly bonded to one another without an intervening adhesive. Two or more electronic elements, which can be semiconductor elements (such as integrated device dies, wafers, etc.), may be stacked on or bonded to one another to form a bonded structure. Conductive contact pads of one element may be electrically connected to corresponding conductive contact pads of another element. Any suitable number of elements can be stacked in the bonded structure. The contact pads may comprise metallic pads formed in a nonconductive bonding region, and may be connected to underlying metallization, such as a redistribution layer (RDL).

In some embodiments, the elements are directly bonded to one another without an adhesive. In various embodiments, a non-conductive or dielectric material of a first element can be directly bonded to a corresponding non-conductive or dielectric field region of a second element without an adhesive. The non-conductive material can be referred to as a nonconductive bonding region or bonding layer of the first element. In some embodiments, the non-conductive material of the first element can be directly bonded to the corresponding non-conductive material of the second element using dielectric-to-dielectric bonding techniques. For example, dielectric-to-dielectric bonds may be formed without an adhesive using the direct bonding techniques disclosed at least in U.S. Pat. Nos. 9,564,414; 9,391,143; and 10,434,749, the entire contents of each of which are incorporated by reference herein in their entirety and for all purposes. Suitable dielectric materials for direct bonding include but are not limited to inorganic dielectrics, such as silicon oxide, silicon nitride, or silicon oxynitride, or can include carbon, such as silicon carbide, silicon oxycarbonitride, silicon carbonitride or diamond-like carbon. In some embodiments, the dielectric materials do not comprise polymer materials, such as epoxy, resin or molding materials.

In various embodiments, hybrid direct bonds can be formed without an intervening adhesive. For example, dielectric bonding surfaces can be polished to a high degree of smoothness. The bonding surfaces can be cleaned and exposed to a plasma and/or etchants to activate the surfaces. In some embodiments, the surfaces can be terminated with a species after activation or during activation (e.g., during the plasma and/or etch processes). Without being limited by theory, in some embodiments, the activation process can be performed to break chemical bonds at the bonding surface, and the termination process can provide additional chemical species at the bonding surface that improves the bonding energy during direct bonding. In some embodiments, the activation and termination are provided in the same step, e.g., a plasma or wet etchant to activate and terminate the surfaces. In other embodiments, the bonding surface can be terminated in a separate treatment to provide the additional species for direct bonding. In various embodiments, the terminating species can comprise nitrogen. Further, in some embodiments, the bonding surfaces can be exposed to fluorine. For example, there may be one or multiple fluorine peaks near layer and/or bonding interfaces. Thus, in the directly bonded structures, the bonding interface between two dielectric materials can comprise a very smooth interface with higher nitrogen content and/or fluorine peaks at the bonding interface. Additional examples of activation and/or termination treatments may be found throughout U.S. Pat. Nos. 9,564,414; 9,391,143; and 10,434,749, the entire contents of each of which are incorporated by reference herein in their entirety and for all purposes.

In various embodiments, conductive contact pads of the first element can also be directly bonded to corresponding conductive contact pads of the second element. For example, a hybrid direct bonding technique can be used to provide conductor-to-conductor direct bonds along a bond interface that includes covalently direct bonded dielectric-to-dielectric surfaces, prepared as described above. In various embodiments, the conductor-to-conductor (e.g., contact pad to contact pad) direct bonds and the dielectric-to-dielectric hybrid bonds can be formed using the direct bonding techniques disclosed at least in U.S. Pat. Nos. 9,716,033 and 9,852,988, the entire contents of each of which are incorporated by reference herein in their entirety and for all purposes.

For example, dielectric bonding surfaces can be prepared and directly bonded to one another without an intervening adhesive as explained above. Conductive contact pads (which may be surrounded by nonconductive dielectric field regions) may also directly bond to one another without an intervening adhesive. In some embodiments, the respective contact pads can be recessed below exterior (e.g., upper) surfaces of the dielectric field or nonconductive bonding regions, for example, recessed by less than 30 nm, less than 20 nm, less than 15 nm, or less than 10 nm, for example, recessed in a range of 2 nm to 20 nm, or in a range of 4 nm to 10 nm. The nonconductive bonding regions can be directly bonded to one another without an adhesive at room temperature in some embodiments in the bonding tool described herein and, subsequently, the bonded structure can be annealed. Annealing can be performed in a separate apparatus. Upon annealing, the contact pads can expand and contact one another to form a metal-to-metal direct bond. Beneficially, the use of hybrid bonding techniques, such as Direct Bond Interconnect, or DBI®, available commercially from Adeia of San Jose, CA, can enable high density of pads connected across the direct bond interface (e.g., small or fine pitches for regular arrays). In some embodiments, the pitch of the bonding pads, or conductive traces embedded in the bonding surface of one of the bonded elements, may be less 40 microns or less than 10 microns or even less than 2 microns. For some applications, the ratio of the pitch of the bonding pads to one of the dimensions of the bonding pad is less than 5, or less than 3 and sometimes desirably less than 2. In other applications the width of the conductive traces embedded in the bonding surface of one of the bonded elements may range between 0.3 to 5 microns. In various embodiments, the contact pads and/or traces can comprise copper, although other metals may be suitable.

Thus, in direct bonding processes, a first element can be directly bonded to a second element without an intervening adhesive. In some arrangements, the first element can comprise a singulated element, such as a singulated integrated device die. In other arrangements, the first element can comprise a carrier or substrate (e.g., a wafer) that includes a plurality (e.g., tens, hundreds, or more) of device regions that, when singulated, form a plurality of integrated device dies. In embodiments described herein, whether a die or a substrate, the first element can be considered a host substrate and is mounted on a support in the bonding tool to receive the second element from a pick-and-place or robotic end effector. The second element of the illustrated embodiments comprises a die. In other arrangements, the second element can comprise a carrier or a flat panel or substrate (e.g., a wafer).

As explained herein, the first and second elements can be directly bonded to one another without an adhesive, which is different from a deposition process. In one application, a width of the first element in the bonded structure can be similar to a width of the second element. In some other embodiments, a width of the first element in the bonded structure can be different from a width of the second element. The width or area of the larger element in the bonded structure may be at least 10% larger than the width or area of the smaller element. The first and second elements can accordingly comprise non-deposited elements. Further, directly bonded structures, unlike deposited layers, can include a defect region along the bond interface in which nanovoids are present. The nanovoids may be formed due to activation of the bonding surfaces (e.g., exposure to a plasma). As explained above, the bond interface can include concentration of materials from the activation and/or last chemical treatment processes. For example, in embodiments that utilize a nitrogen plasma for activation, a nitrogen peak can be formed at the bond interface. In embodiments that utilize an oxygen plasma for activation, an oxygen peak can be formed at the bond interface. In some embodiments, the bond interface can comprise silicon oxynitride, silicon oxycarbonitride, or silicon carbonitride. As explained herein, the direct bond can comprise a covalent bond, which is stronger than van Der Waals bonds. The bonding layers can also comprise polished surfaces that are planarized to a high degree of smoothness. For example, the bonding layers may have a surface roughness of less than 2 nm root mean square (RMS) per micron, or less than 1 nm RMS per micron.

In various embodiments, metal-to-metal bonds between the contact pads in direct hybrid bonded structures can be joined such that conductive features grains, for example copper grains on the conductive features grow into each other across the bond interface. In some embodiments, the copper can have grains oriented along the 111 crystal plane for improved copper diffusion across the bond interface. The bond interface can extend substantially entirely to at least a portion of the bonded contact pads, such that there is substantially no gap between the nonconductive bonding regions at or near the bonded contact pads. In some embodiments, a barrier layer may be provided under the contact pads (e.g., which may include copper). In other embodiments, however, there may be no barrier layer under the contact pads, for example, as described in US 2019/0096741, which is incorporated by reference herein in its entirety and for all purposes.

Unless the context clearly requires otherwise, throughout the description and the claims, the words “comprise,” “comprising,” “include,” “including” and the like are to be construed in an inclusive sense, as opposed to an exclusive or exhaustive sense; that is to say, in the sense of “including, but not limited to.” The word “coupled”, as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Moreover, as used herein, when a first element is described as being "on" or "over" a second element, the first element may be directly on or over the second element, such that the first and second elements directly contact, or the first element may be indirectly on or over the second element such that one or more elements intervene between the first and second elements. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A bonded structure comprising:

a first element including a first insulating layer and at least two first conductive features disposed in the first insulating layer;

a second element including a second insulating layer, a third insulating layer on the second insulating layer, and at least two second conductive features disposed in the second insulating layer, the first element being directly bonded to the third insulating layer of the second element with the at least two first conductive features aligned with the at least two second conductive features; and an isolation feature in the second insulating layer and between the at least two second conductive features, the isolation feature having a dielectric constant lower than a dielectric constant of the second insulating layer, wherein the isolation feature extends to a bonding interface between the first and second elements.

2. The bonded structure of claim 1, wherein the first insulating layer and the third insulating layer are directly bonded without an intervening adhesive.

3. The bonded structure of claim 1, wherein the isolation feature extends through the third insulating layer to the bonding interface.

4. The bonded structure of claim 1, wherein the isolation feature between the at least two second conductive features reduces a parasitic capacitance between the at least two second conductive features.

5. The bonded structure of claim 1, wherein the isolation feature is filled with a low dielectric constant material.

6. The bonded structure of claim 1, wherein the dielectric constant of the isolation feature is less than about 3.5.

7. The bonded structure of claim 1, wherein the at least two second conductive features are disposed near or at the bonding interface between the first and second elements.

8. The bonded structure of claim 7, wherein a width of the isolation feature parallel to the bonding interface is smaller than a width of either one of the at least two second conductive features parallel to the interface.

9. The bonded structure of claim 7, wherein a width of the isolation feature parallel to the bonding interface is about 1 μm to about 2 μm.

10. The bonded structure of claim 7, wherein a depth of the isolation feature orthogonal to the bonding interface is at least 10% of a depth of either one of the at least two second conductive features orthogonal to the interface.

11. The bonded structure of claim 7, wherein the isolation feature surrounds one of the at least two second conductive features in a plane substantially parallel to the bonding interface.

12. The bonded structure of claim 1, further comprising an additional isolation feature in the first insulating layer and between the at least two first conductive features, the additional isolation feature having a dielectric constant lower than a dielectric constant of the first insulating layer.

13. The bonded structure of claim 1, wherein a thickness of the third insulating layer is in a range of 20-100 nm.

14. The bonded structure of claim 1, wherein the isolation feature is at least partially filled with air or an inert gas.

15. A method of forming a bonded structure, the method comprising:

providing a first element including a first insulating layer and at least two first conductive features disposed in the first insulating layer;

providing a second element including a second insulating layer, a third insulating layer on the second insulating layer, and at least two second conductive features disposed in the second insulating layer;

providing an isolation feature in the second insulating layer and between the at least two second conductive features, the isolation feature having a dielectric constant lower than a dielectric constant of the second insulating layer; and directly bonding the first element to the third insulating layer of the second element along a bonding interface with the at least two first conductive features aligned with the at least two second conductive features, wherein the isolation feature extends to the bonding interface.

16. The method of claim 15, wherein directly bonding the first element to the second element comprises directly bonding the first insulating layer to the second third insulating layer.

17. The method of claim 15, wherein the isolation feature extends through the third insulating layer extends to the bonding interface.

18. The method of claim 15, further comprising filling the isolation feature with a low dielectric constant material.

19. The method of claim 15, further comprising partially filling the isolation feature with a low dielectric constant material.

20. The method of claim 15, wherein the at least two second conductive features are disposed near or at the bonding interface between the first and second elements.

21. The method of claim 20, wherein a width of the isolation feature parallel to the bonding interface is smaller than a width of either one of the at least two second conductive features parallel to the interface.

22. An electronic device configured for direct bonding, comprising:

an insulating layer of a first element;

a first conductive feature and a second conductive feature in the insulating layer; and a first isolation feature in the insulating layer, the first isolation feature separating the first and second conductive features and having a dielectric constant lower than that of the insulating layer, the first isolation feature comprising a continuous solid material, wherein the first and second conductive features and the first isolation feature are disposed at a direct bonding interface configured for direct hybrid bonding.

23. The electronic device of claim 22, wherein the direct bonding interface comprises a surface planarized to a roughness of less than 2 nm root mean square per micron.

24. The electronic device of claim 22, wherein the continuous solid material of the isolation feature is fluorine-doped silicon oxide, organosilicate glass, or a polymeric material.

25. A microelectronic device configured for direct bonding, comprising:

an insulating layer;

at least two conductive features disposed in the insulating layer; and an isolation feature disposed in the insulating layer, the isolation feature disposed between the at least two conductive features, the isolation feature disposed at opposite sides of at least one of the at least two conductive features as seen in a cross-sectional view, the isolation feature having a dielectric constant lower than that of the insulating layer, the isolation feature comprising a continuous solid material, wherein the first and second conductive features are disposed near or at a bonding surface configured for direct hybrid bonding.

26. The microelectronic device of claim 25, wherein the isolation feature is disposed at least partially surrounding the one of the at least two conductive features.

* * * * *